(12) United States Patent
Sutherland et al.

(10) Patent No.: US 6,692,666 B2
(45) Date of Patent: *Feb. 17, 2004

(54) SWITCHABLE VOLUME HOLOGRAM MATERIALS AND DEVICES

(75) Inventors: Richard L. Sutherland, Dayton, OH (US); Lalqudi V. Natarajan, Beavercreek, OH (US); Vince P. Tondiglia, Dayton, OH (US); Timothy J. Bunning, Beavercreek, OH (US); W. Wade Adams, Dayton, OH (US)

(73) Assignee: Science Applications International Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/347,624

(22) Filed: Jul. 2, 1999

(65) Prior Publication Data

US 2003/0197157 A1 Oct. 23, 2003

Related U.S. Application Data

(63) Continuation of application No. 08/680,292, filed on Jul. 12, 1996, now Pat. No. 5,942,157.

(51) Int. Cl.⁷ .............................. F21V 9/00; G02B 5/32; G02B 5/20
(52) U.S. Cl. ...................... 252/582; 252/299.1; 359/15; 359/589; 345/88; 430/1
(58) Field of Search .......................... 252/582; 430/1; 369/112.16, 121; 345/88; 349/80; 359/498, 15, 614, 589

(56) References Cited

U.S. PATENT DOCUMENTS

| | | | |
|---|---|---|---|
| 3,580,655 A | 5/1971 | Leith et al. ................... 350/3.5 |
| 3,658,526 A | 4/1972 | Haugh ............................ 96/27 |
| 3,667,946 A | 6/1972 | Sturdevant ................... 96/35.1 |
| 3,758,186 A | 9/1973 | Brumm ....................... 350/3.5 |
| 4,003,629 A | 1/1977 | Baues et al. ............. 350/96 C |
| 4,006,963 A | 2/1977 | Baues et al. ............. 350/96 C |
| 4,045,124 A | 8/1977 | Pollack et al. |
| 4,124,947 A | 11/1978 | Kuhl et al. ................... 40/453 |
| 4,374,371 A | 2/1983 | Narancic ..................... 337/159 |
| 4,416,540 A | 11/1983 | Nicholson .................. 350/3.69 |
| 4,560,249 A | 12/1985 | Nishiwaki et al. ............. 359/3 |
| 4,673,241 A | 6/1987 | Nishiwaki et al. ......... 350/3.64 |
| 4,688,900 A | 8/1987 | Doane et al. ................... 359/3 |
| 4,728,547 A | 3/1988 | Vaz et al. |
| 4,810,063 A | 3/1989 | Fergason |
| 4,818,070 A | 4/1989 | Gunjima et al. |
| 4,832,424 A | 5/1989 | McGrew .................... 350/3.65 |
| 4,856,876 A | 8/1989 | Fergason |
| 4,857,425 A | 8/1989 | Phillips .......................... 430/1 |
| 4,923,269 A | 5/1990 | Healey ................... 350/96.15 |
| 4,938,568 A | 7/1990 | Margerum et al. ............. 359/3 |
| 4,942,102 A | 7/1990 | Keys et al. ..................... 430/1 |
| 5,003,386 A | 3/1991 | Doyle et al. ................. 358/90 |
| 5,011,624 A | 4/1991 | Yamagishi et al. ...... 252/299.5 |
| 5,014,709 A | 5/1991 | Bjelkhagen et al. ......... 128/654 |
| 5,084,203 A | 1/1992 | Sansone et al. |
| 5,096,282 A | 3/1992 | Margerum et al. ............. 359/3 |
| 5,105,298 A | 4/1992 | Schellenberg ................. 359/3 |
| 5,136,666 A | 8/1992 | Anderson et al. ............. 385/24 |
| 5,166,813 A | * 11/1992 | Metz ........................... 359/15 |
| 5,182,180 A | 1/1993 | Gambogi, Jr. et al. .......... 430/1 |
| 5,182,665 A | 1/1993 | O'Callaghan et al. ........ 359/95 |
| 5,198,912 A | 3/1993 | Ingwall et al. |
| 5,210,630 A | 5/1993 | Heynderickx et al. ...... 359/106 |

(List continued on next page.)

FOREIGN PATENT DOCUMENTS

| | | | |
|---|---|---|---|
| CA | 544591 | 8/1957 | |
| EP | 0 087 281 A1 | 8/1983 | ............ G03H/1/20 |
| EP | 0 422 689 A2 | 1/1987 | |
| EP | 0 672 386 A1 | 9/1995 | ............ A61B/17/22 |
| EP | 0 856 765 A1 | 8/1998 | ......... G02F/1/1333 |

(List continued on next page.)

OTHER PUBLICATIONS

International Search Report, dated Oct. 13, 1999.
Stroke, Funkhouser, Leonard, Indebetoew and Zech , Article entitled, "Hand–Held Holography" by, Sep. 19, 1966, 1 p.
Kasnow and Bigelow, Article "Diffraction From A Liquid Crystal Phase Grating" by (*Applied Optics*/vol. 12, No. 10/Oct. 1973).

(List continued on next page.)

*Primary Examiner*—Shean C. Wu
(74) *Attorney, Agent, or Firm*—Kilpatrick Stockton LLP

(57) ABSTRACT

A new photopolymerizable material allows single-step, fast recording of volume holograms with properties that can be electrically controlled. Polymer-dispersed liquid crystals (PDLCs) in accordance with the invention preferably comprise a homogeneous mixture of a nematic liquid crystal and a multifunctional pentaacrylate monomer, in combination with photoinitiator, coinitiator and cross-linking agent. Optionally, a surfactant such as octanoic acid may also be added. The PDLC material is exposed to coherent light to produce an interference pattern inside the material. Photopolymerization of the new PDLC material produces a hologram of clearly separated liquid crystal domains and cured polymer domains. Volume transmission gratings made is with the new PDLC material can be electrically switched between nearly 100% diffraction efficiency and nearly 0% diffraction efficiency. By increasing the frequency of the switching voltage, switching voltages in the range of 50 Vrms can be achieved. The optional use of surfactant allows low switching voltages at lower frequencies than without surfactant. In an alternative embodiment, a PDLC material in accordance with the invention can be utilized to form reflection gratings, including switchable reflection gratings. In still further embodiments, a PDLC material in accordance with the invention can be used to form switchable subwavelength gratings. By further processing, static transmission reflection, and subwavelength PDLC materials can be formed.

18 Claims, 13 Drawing Sheets

U.S. PATENT DOCUMENTS

| | | | | |
|---|---|---|---|---|
| 5,227,859 | A | 7/1993 | Leib et al. | 556/347 |
| 5,227,906 | A | 7/1993 | Tokumitsu | 359/117 |
| 5,235,445 | A | 8/1993 | Hirai et al. | |
| 5,240,636 | A | 8/1993 | Doane et al. | |
| 5,264,950 | A | 11/1993 | West et al. | |
| 5,270,843 | A | 12/1993 | Wang | 359/52 |
| 5,272,550 | A | 12/1993 | Dickson et al. | 359/3 |
| 5,291,317 | A | 3/1994 | Newswanger | 359/15 |
| 5,299,289 | A | 3/1994 | Omae et al. | 359/95 |
| 5,303,322 | A | 4/1994 | Winston et al. | 385/146 |
| 5,313,317 | A | 5/1994 | Saburi et al. | 359/13 |
| 5,323,251 | A | 6/1994 | Coates et al. | 359/51 |
| 5,328,800 | A | 7/1994 | Yokoya et al. | 430/203 |
| 5,330,264 | A | 7/1994 | Ando et al. | 359/12 |
| 5,354,498 | A | 10/1994 | Akashi et al. | 252/299.01 |
| 5,356,557 | A | 10/1994 | Jubb et al. | 252/299.01 |
| 5,363,228 | A | 11/1994 | DeJule et al. | 359/117 |
| 5,384,067 | A | 1/1995 | Doane et al. | 359/3 |
| 5,453,338 | A | 9/1995 | Suga et al. | 430/1 |
| 5,471,326 | A | 11/1995 | Hall et al. | 359/15 |
| 5,488,681 | A | 1/1996 | Deacon et al. | 385/37 |
| 5,499,118 | A | 3/1996 | Wreede et al. | 359/12 |
| 5,529,861 | A | 6/1996 | Redfield | 430/1 |
| 5,544,268 | A | 8/1996 | Bischel et al. | 385/4 |
| 5,547,786 | A | 8/1996 | Brandstetter et al. | 430/1 |
| 5,593,615 | A | 1/1997 | Nerad et al. | 252/299.01 |
| 5,641,426 | A | 6/1997 | Nerad et al. | 252/299.01 |
| 5,648,857 | A | 7/1997 | Ando et al. | 359/12 |
| 5,661,533 | A | 8/1997 | Wu et al. | 349/169 |
| 5,661,577 | A | 8/1997 | Jenkins et al. | 359/11 |
| 5,680,233 | A | 10/1997 | Faris et al. | 359/41 |
| 5,682,214 | A | 10/1997 | Amako et al. | 349/74 |
| 5,695,682 | A | 12/1997 | Doane et al. | 252/299.01 |
| 5,698,134 | A | 12/1997 | Jubb et al. | 252/299.01 |
| 5,698,343 | A | 12/1997 | Sutherland et al. | 430/1 |
| 5,706,375 | A | 1/1998 | Mihailov et al. | 385/24 |
| 5,725,970 | A | 3/1998 | Martin et al. | 430/2 |
| 5,731,853 | A | 3/1998 | Taketomi et al. | 349/15 |
| 5,734,485 | A | 3/1998 | Buchkremer et al. | 359/25 |
| 5,748,272 | A | 5/1998 | Tanaka et al. | 349/86 |
| 5,751,452 | A | 5/1998 | Tanaka et al. | 359/52 |
| 5,771,320 | A | 6/1998 | Stone | 385/16 |
| 5,832,148 | A | 11/1998 | Yariv | 385/16 |
| 5,852,504 | A | 12/1998 | Kato et al. | 359/9 |
| 5,875,012 | A | 2/1999 | Crawford et al. | 349/74 |
| 5,915,051 | A | 6/1999 | Damask et al. | 385/16 |
| 5,930,011 | A | 7/1999 | Gambogi, Jr. et al. | 359/15 |
| 5,937,115 | A | 8/1999 | Domash | 385/16 |
| 5,942,157 | A | * | 8/1999 | Sutherland et al. | 252/582 |
| 6,115,152 | A | 9/2000 | Popovich et al. | 359/15 |
| 6,172,778 | B1 | 1/2001 | Reinhorn et al. | 359/15 |
| 6,211,976 | B1 | 4/2001 | Popovich et al. | 359/15 |

FOREIGN PATENT DOCUMENTS

| | | | | |
|---|---|---|---|---|
| EP | 0 856 766 A2 | 8/1998 | | G02F/1/1333 |
| EP | 0 856 768 A2 | 8/1998 | | G02F/1/1347 |
| EP | 0 867 749 A2 | 9/1998 | | G02F/1/1335 |
| GB | 2222696 | 9/1988 | | |
| GB | 2281566 A | 2/1994 | | |
| GB | 2292745 | 8/1995 | | |
| JP | 60189729 A | 9/1985 | | G02F/1/133 |
| JP | 61-90185 | 8/1986 | | |
| JP | 1-68784 A | 3/1989 | | G03H/1/20 |
| JP | 3-188479 A | 8/1991 | | G03H/1/20 |
| JP | 10319237 | 12/1998 | | G02B/5/32 |
| WO | WO 89/06264 | 7/1989 | | C09K/19/00 |
| WO | WO 94/04958 | 8/1993 | | |
| WO | WO 97/27519 | 7/1997 | | G03H/1/04 |
| WO | WO 99/09440 | 2/1999 | | G02B/6/12 |

OTHER PUBLICATIONS

Edited by H. Bennett, Cooncise Chemical and Technical Dictionary, F.A.I.C.; 1974 Chemical Publishing Co., Inc.

Hori, Asai and Fukai, Article "Field–Controllable Liquid–Crystal Phase Grating," vol. ED–16, p. 1734, 1979 IEEE (4 pgs.).

R. L. Sutherland, Article "Optical limiters, switches, and filters based on polymer dispersed liquid crystals" by, *SPIE* vol. 1080 Liquid Crystal Chemistry, Physics, and Applications 1989, 8 pgs.

Lackner, Margerum, Ramos and Lim, Article "Droplet Size Controled In Polymer Dispersed Liquid Crystal Films" by (*SPIE* vol. 1080 Liquid Crystal Chemistry, Physics and Applications 1989, 9 pgs.).

Ingwall and Adams, Article "Hologram: Liquid Crystal Composites," *SPIE* vol. 1555 Computer and Optically Generated Holographic Optics 1991, pp. 279–290.

Lawrence H. Domash, Article "Applications of Dynamic Holograms For Quasi–Volume Storage" *SPIE* vol. 1773c, "Very Large Optical Memories–Materials and System Architectures," (Kowel–1992, 5 pgs.).

Murai, Gotoh, Suzuki, Hasegawa and Mizoguchi, Article "Electro–Optic Properties For Liquid Crystal Phase Gratings" *SPIE* vol. 1665 Liquid Crystal Materials, Devices and Applications 1992, pp. 230–239.

Sutherland, Natarajan and Tondiglia, Article "Bragg Gratings In An Acrylate Polymer Consisting Of Periodic Polymers–Dispersed Liquid–Crystal Planes," 1993 American Chemical Society, 6 pgs.

Sutherland, Tondiglia and Natarajan, Article "Electrically Switchable Volume Gratings In Polymer–Dispersed Liquid Crystals," Appl. Phys. Lett. 64(9), Feb. 28, 1994, pp. 1074–1076.

Article "Diffractive And Holographic Optics Technology" *SPIE Reprint*, Jan. 1994, vol. 2152, 12 pgs.).

T. J. Bunning, L. V. Natarajan, V. Tondiglia and R. L. Sutherland, *Polymer Communications*, Morphology of Reflection Holograms Formed in situ Using Polymer–Dispersed Liquid.

Crystals, Received Jun. 7, 1995; Revised Sep. 29, 1995.

Tondiglia, Natarajan and Sutherland , Article "Volume Holographic Image Storage And Electro–Optical Readout In A Polymer–Dispersed Liquid–Crystal Film" (*Optics Letters*, Jun. 1, 1995, vol. 20, No. 11, 4 pgs.).

L.V. Natarajan, et al., Article, "Electro–Optical Switching Characteristics of Volume Holograms in Polymer Dispersed Liquid Crystals," Received Jul. 17, 1995.

R. L. Sutherland, L. V. Natarajan and Tondiglia, Article "Switchable holograms in new photopolymer–liquid crystal composite materials", Society of Photo–Optical Instrumentation Engineers (SPIE), Proceedings Reprint, vol. 2404, reprinted from *Diffractive and Holographic Optics Technology II* (1995).

T. J. Bunning, L. V. Natarajan, V. Tondiglia and R. L. Sutherland, "The Morphology and Performance of Holographic Transmission Gratings Recorded in Polymer Dispersed Liquid Crystals," Polymer, vol. 36, No. 14, pp. 2699–2708 (1995).

R. L. Sutherland, L. V. Natarajan and V. P. Tondiglia, Article, "Switchable holograms in new photopolymer–liquid crystal composite materials," Proceedings Reprint, Reprinted from Diffractive and Holographic Optics Technology II, Feb. 9–10, 1995.

T. J. Bunning, L. V. Natarajan, V. P. Tondiglia and R. L. Sutherland, Article, "The effects of eliminating the chain extender and varying the grating periodicity on the morphology of holographically written Bragg gratings," Proceedings Reprint, Reprinted from Liquid Crystal Materials, Devices, and Applications IV, Jan. 31–Feb. 1, 1996.

R.L. Sutherland, L. V. Natarajan, V. P. T ondiglia and T. J. Bunning, Article, "Analysis of periodic polymer–dispersed liquid crystal structures for dynamic hologram applications," Proceedings Reprint, Reprinted from Application and Theory of Periodic Structures, Jul. 10–12, 1995.

R. L. Sutherland, L. V. Natarajan, T. J. Bunning and V. P. Tondiglia, Article, "Switchable Bragg Gratings Formed in situ Within A Polymer–Dispersed Liquid Crystal Composite Medium," 1996 Materials Research Society.

G. S. Iannacchione, D. Finotello, L.V. Natarajan, R. L. Sutherland, V. P. Tondiglia, T. J. Bunning and W. W. Adams, Article, "Deuterium NMR and Morphology Study of Polymer–Dispersed Liquid–Crystal Bragg Gratings," Europhysics Letters 36 (6). pp. 425–430 Nov. 20, 1996.

L.V. Natarajan, R. L. Sutherland, V. P. Tondiglia, T.J. Bunning and R. M. Neal, Article, "Electrically switchable holograms containing novel PDLC structures," Proceedings of Spie Reprint, Reprinted from Liquid Crystals, Jul. 28–29, 1997.

R. L. Sutherland, L.V. Natarajan, V. P. Tondiglia and T. J. Bunning, Article, "Switchable Holograms for Displays and Other Applications", Abstract, SPIE vol. 3421, 1998.

L. H. Domash, Y. Chen, B. Gomatam and C. Gozewski, Article, "Switchable–Focus Lenses in Holographic Polymer Dispersed Liquid Crystal", Proc. SPIE vol. 2689, Diffractive and Holographic Optics Technology III, Paper 26, 1996.

J. Zhang, et al., "Switchable Holograms Recorded in Liquid Crystalline Monomers," SPIE, vol. 2042, pp. 238–247 (Jan., 1997).

J. Zhang, et al., "Switchable Liquid Crystalline Photopolymer Media for Holography," J. Am. Chem. Soc., vol. 114(4), pp. 1506–1507 (1992).

International Search Report for Application No. PCT/US97/12577, dated Jan. 14, 1998 (mailing date).

Written Opinion for Application No. PCT/US97/12577, dated Apr. 28, 1998 (mailing date).

Preliminary Examination Report for Application No. PCT/US97/12577, dated Sep. 3, 1998 (mailing date).

European Search Report for Application No. EP 97 93 7988, dated Oct. 13, 1999.

International Search Report for Application No. PCT/US00/34661, dated Jul. 17, 2001.

International Preliminary Examination Report for Application No. PCT/US00/34661, dated Feb. 20, 2002.

International Search Report for Application No. PCT/US01/40691, dated Sep. 5, 2001 (mailing date).

Written Opinion for Application No. PCT/US01/40691, dated May 15, 2002 (mailing date).

Preliminary Examination Report for Application No. PCT/US01/40691, dated Sep. 10, 2002 (mailing date).

R.T. Pogue, et al., "Monomer Functionality Effects in the Anisotropic Phase Separation of Liquid Crystals," Polymer 41, pp. 733–741, 2000.

M. Escuti, et al., "5.3: A Model of the Fast–Switching Polymer–Stabilized IPS Configuration," SID International Symposium, Digest of Technical Papers, First Edition, pp. 32–35, May, 1999.

C. C. Bowley, et al., "45.3: Electro–Optic Investigations of H–PDLCS: The Effect of Monomer Functionality on Display Performance," SID International Symposium, Digest of Technical Papers, First Edition, pp. 958–961, May, 1999.

C. C. Bowley, et al., "Advances in Holographic Polymer Dispersed Liquid Crystal Technology," in Liquid Crystal Materials and Devices, Mat. Res. Soc. Symposium Proceedings, vol. 559, pp. 97–107, 1999.

C. C. Bowley, et al., "Morphology of Holographically-Formed Polymer Dispersed Liquid Crystals (H–PDLC)," Mol. Cryst. Liq. Cryst., vol. 331, pp. 209–216, 1999.

M. Date, et al., "Full–Color Reflective Display Device Using Holographically Fabricated Polymer–Dispersed Liquid Crystal (HPDLC)," Journal of the Society for Information Display (SID), vol. 7, pp. 17–22, 1999.

J. A. Firehammer, et al., "Lasing Pixels: A New Application for Polymer Dispersed Liquid Crystals (PDLCs)," Mol. Cryst. Liq. Cryst., vol. 331, pp. 165–172, 1999.

Seferis, James C., "Refractive Indices of Polymers," Polymer Handbook, $4^{th}$ Edition, John Wiley & Sons, Inc., pp. 571–582, Copyright 1999.

L. V. Natarajan, et al., "Holographic PDLCs for Optical Beam Modulation, Deflection, and Dynamic Filter Applications," SPIE Proceedings, vol. 3292, pp. 44–51, Jan. 28–29, 1998.

K. Thilo Weitzel, et al., "Hologram Recording in DuPont Photopolymer Films by Use of Pulse Exposure," Optics Letter, vol. 22, No. 24, Dec. 15, 1997.

L. V. Natarajan, et al., "Electrically Switchable Holograms Containing Novel PDLC Structures," SPIE Proceedings, vol. 3143, pp. 182–190, Jul. 28–29, 1997.

N. M. Lawandy, et al., "L1.3: Lasing Pixel PDLC Light Valves for Projection Applications," SID International Symposium, Digest of Technical Papers, First Edition, pp. 1001–1004, May, 1997.

G. P. Crawford, et al., "Reflective Color LCDs Based on H–PDLC and PSCT Technologies," Journal of the Society for Information Display, vol. 5, No. 1, pp. 45–48, 1997.

V. N. Mikhailov, et al., "Pulse Hologram Recording in DuPont's Photopolymer Films," SPIE, vol. 3011, pp. 200–202, 1997.

D. Schwarze–Haller and F. Noack, "Nuclear Magnetic Resonance Field–Cycling Proton Relaxation Study of Polymer Dispersed Liquid Crystals," J. Chem. Phys., vol. 105, No. 11, pp. 4823–4832, Sep., 1996.

G. P. Crawford, et al., "Reflective Color LCDs Based on H–PDLC and PSCT Technologies," SID International Symposium, Digest of Applications Papers, pp. 99, May 14–16, 1996.

Richard L. Sutherland, et al., "The Phyics of Photopolymer-Liquid Crystal Composite Holographic Gratings," SPIE Proceedings, vol. 2689, pp. 158–169, May, 1996.

T. J. Bunning, et al., "Switchable Bragg Gratings Formed in situ Within a Polymer Dispersed Liquid Crystal Composite Medium," Materials Research Society, pp. 331–343, Apr. 8–11, 1996.

N. Kawatsuki and H. Ono, "Electro–Optical Properties of Polymer/(Liquid Crystal) Composite Film Fabricated by Two–Step Phase Separation Method," Chemistry Letters, No. 5, pp. 333–334, 1995.

Richard L. Sutherland, et al., "Development of Photopolymer–Liquid Crystal Composite Materials for Dynamic Hologram Applications," SPIE Proceedings, vol. 2152, pp. 303–313, Jan. 26–28, 1994.

K. Tanaka, et al., "Holographically Formed Liquid–Crystal/Polymer Device for Reflective Color Display," *Journal of the Society for Information Display*, vol. 2, No. 1, pp. 37–38, 1994.

L. Domash, et al., "Programmable Beamlet Generator, Dynamic Lens, and Optical Memory Using Electrically Switched Holographic Devices," *SPIE Proceedings*, vol. 2026, pp. 642–652, Nov., 1993.

D. J. Lougnot, et al., "Photopolymers for Holographic Recording: IV. New Self–Processing Formulations Based on β–Hydroxy Ethyloxazolidone Acrylate," *Pure Appl. Opt.*, vol. 2, pp. 383–392, 1993.

H. I. Bjelkhagen, et al., "High–Resolution Contact Denisyuk Holography," *Applied Optics*, vol. 31, No. 8, pp. 1041–1047, Mar. 10, 1992.

G. von Bally, et al., "Gradient–Index Optical Systems in Holographic Endoscopy," *Applied Optics*, vol. 23, No. 11, pp. 1725–1729, Jun. 1, 1984.

Allan R. Tokuda, et al., "Holocamera for 3–D Micrography of the Alert Human Eye," *Applied Optics*, vol. 19, No. 13, pp. 2219–2225, Jul. 1, 1980.

Stephen A. Benton, et al., "One–Step White–Light Transmission Holography," *SPIE*, vol. 215, pp. 156–161, 1980.

Stephen A. Benton, et al., "One–Step White–Light Transmission Holography," *SPIE*, vol. 212, pp. 2–7, 1979.

G. W. Stroke and A. E. Labeyrie, "White–Light Reconstruction of Holographic Images Using the Lippmann–Bragg Diffraction Effect," *Physics Letters*, vol. 20, No. 4, pp. 368–370, Mar. 1, 1966.

* cited by examiner

SLANTED
TRANSMISSION

SLANTED
REFLECTION

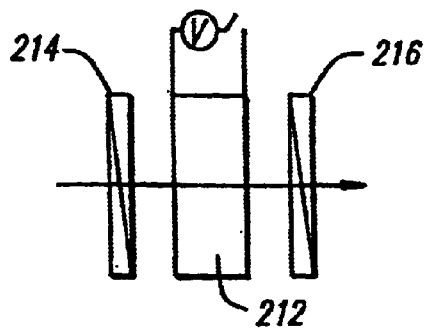
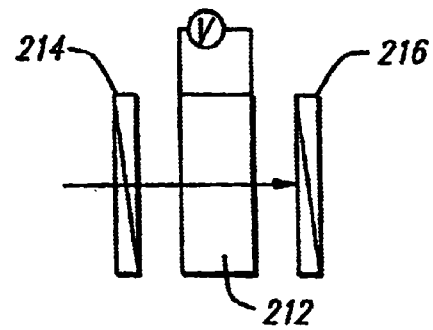
FIG. 14c — LIGHT TRANSMITTED
FIG. 14d — LIGHT BLOCKED
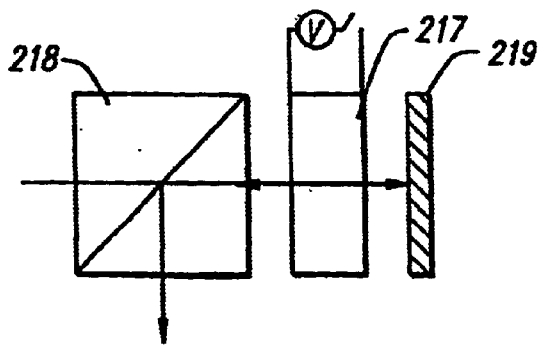
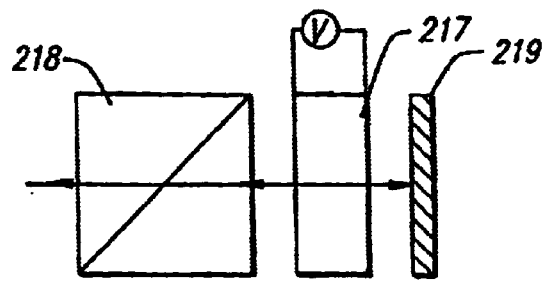
FIG. 15a — TRANSMITTED
FIG. 15b — RETRO-REFLECTED

UNSWITCHED STATE

SWITCHED STATE

SWITCHABLE VOLUME HOLOGRAM MATERIALS AND DEVICES

This is a continuation of application Ser. No. 08/680,292, filed Jul. 12, 1996, now U.S. Pat. No. 5,942,157.

FIELD OF THE INVENTION

The present invention relates generally to photopolymerizable materials, and more specifically to polymer-dispersed liquid crystal materials suitable for recording volume holograms.

BACKGROUND OF THE INVENTION

Typical state-of-the-art holographic materials do not have an electro-optical nature which can be exploited for real time control of their optical properties. That is, once the hologram is fixed, its optical characteristics cannot be changed. Thus, it is seen that there is a need for materials that can record volume holograms with properties that can be electrically controlled.

Liquid crystals have long been utilized in the prior art for their ability to change their optical orientation in the presence of an electric field. Additionally, liquid crystals can dramatically increase the diffraction efficiency of a volume hologram of which they are a part. Together, these properties offer the very desirable possibility of electrically switching the diffraction efficiency of volume holograms for use in a wide variety of optical information processing and display applications.

The prior art has attempted to combine the properties of liquid crystals with holograms by a variety of methods. Unfortunately, most of these prior art devices are complex to manufacture and are not successful at offering all the advantages of volume holographic gratings.

One approach for combining the advantages of liquid crystals with volume holographic gratings has been to first make a holographic transmission grating by exposing a photopolymerizable material with a conventional two-beam apparatus for forming interference patterns inside the material. After exposure, the material is processed to produce voids where the greatest amount of exposure occurred, that is, along the grating lines, and then, in a further step, the pores are infused with liquid crystals. Unfortunately, these materials are complex to manufacture and do not offer flexibility for in situ control over liquid crystal domain size, shape, density, or ordering.

Polymer-dispersed liquid crystals (PDLCs) are formed from a homogeneous mixture of prepolymer and liquid crystals. As the polymer cures, the liquid crystals separate out as a distinct microdroplet phase. If the polymer is a photopolymer, this phase separation occurs as the prepolymer is irradiated with light. If a photopolymerizable polymer-dispersed liquid crystal material is irradiated with light in a suitable pattern, a holographic transmission grating can be made inside the cured polymer comprising gratings of cured polymer separated by phase separated liquid crystals. The prior art has attempted to employ polymer-dispersed liquid crystal materials for writing volume gratings, but, despite a variety of approaches, has not been able to achieve high efficiency in the Bragg regime, high density (small grating spacing) capability, or low voltage (<100 Vrms) switching for films in the range of 15 microns thickness. The inability to make an electrically switchable volume hologram that can be switched at voltages less than 100 volts has been a particular deficiency in the prior art in that lower voltages are necessary to be compatible with conventional display and information processing technology.

OBJECTS OF THE INVENTION

It is, therefore, a principal object of the present invention to provide an improved polymer-dispersed liquid crystal system suitable for recording volume holograms.

It is a particular object of the present invention to provide a polymer-dispersed liquid crystal system that has a fast curineg rate to produce small liquid crystal droplets, particularly in the range of 0.01–0.05 microns, for greater clarity of any resulting film and for writing finer gratings.

It is another object of the present invention to provide a single-step, fast holographic recording material.

It is a further object of the present invention to provide electrically switchable volume holograms that can be switched at voltages less than 100 volts.

It is also an object of the present invention to provide an improved polymer-dispersed liquid crystal system suitable for recording reflection gratings, including, in particular, switchable reflection gratings.

It is also an object of the present invention to provide an improved polymer-dispersed liquid crystal system suitable for recording subwavelength gratings, including, in particular switchable subwavelength gratings.

These and other objects of the present invention will become apparent as the description of certain representative embodiments proceeds.

SUMMARY OF THE INVENTION

The present invention provides a novel photopolymerizable material for single-step, fast recording of volume holograms with properties that can be electrically controlled. The unique discovery of the present invention is a new homogeneous mixture of a nematic liquid crystal and a multifunctional pentaacrylate monomer, with a photoinitiator, a coinitiator and a cross-linking agent, that accomplishes the objects of the invention, particularly the object of fast curing speed and small liquid crystal droplet size.

Accordingly, the present invention is directed to a polymer-dispersed liquid crystal ("PDLC") material, comprising the monomer dipentaerythritol hydroxypentaacrylate, a liquid crystal, a cross-linking monomer, a coinitiator and a photoinitiator dye. The polymer-dispersed liquid crystal material may optionally further comprise a surfactant. The PDLC material may be approximately 10–40 wt % of the liquid crystal. The PDLC material may be approximately 5–15 wt % of the cross-linking monomer. The amount of the coinitiator may be $10^{-3}$ to $10^{-4}$ gram moles and the amount of the photoinitiator dye-may be $10^{-5}$ to $10^{-6}$ gram moles. The surfactant, when present, may be up to approximately 6 wt % of the PDLC material.

The present invention is also directed to an electrically switchable hologram, comprising a pair of transparent plates, and sandwiched between the transparent plates, a volume hologram made by exposing an interference pattern inside a polymer-dispersed liquid crystal material, the polymer-dispersed liquid crystal material comprising, before exposure, the monomer dipentaerythritol hydroxypentaacrylate, a liquid crystal, a cross-linking monomer, a coinitiator and a photoinitiator dye. The electrically switchable hologram may optionally further comprise a surfactant.

The present invention is additionally directed to a method for reducing the switching voltage needed to switch the optical orientation of liquid crystals in a polymer-dispersed liquid crystal material, comprising the step of using alternating current switching voltage frequencies greater than 1000 Hz.

It is a feature of the present invention that a very clear and orderly separation of liquid crystal from cured polymer results, so as to produce high quality holographic transmission gratings. The prior art has achieved generally only a distribution of large and small liquid crystal domains and not the clear, orderly separation made possible by the present invention.

It is also a feature of the present invention that volume Bragg gratings with small grating spacings (approximately 4,000 lines per mm) can be recorded.

It is another feature of the present invention that in situ control of domain size, shape, density, and ordering is allowed.

It is yet another feature of the present invention that holograms can be recorded using conventional optical equipment and techniques.

It is a further feature of the present invention that a unique photopolymerizable prepolymer material is employed. This unique material can be used to record holograms in a single step.

It is also a feature of the present invention that the PDLC material has an anisotropic spatial distribution of phase-separated liquid crystal droplets within a photochemically-cured polymer matrix.

It is an advantage of the present invention that single-step recording is nearly immediate and requires no later development or further processing.

It is another advantage of the present invention that uses thereof are not limited to transmission gratings, but can be extended to other holograms such as optical storage devices and reflection and transmission pictorial holograms.

It is also an advantage that, unlike holograms made with conventional photograph-type films or dichromated gels, holograms in accordance with the present invention can be exposed in a one-step process that requires little or no further processing.

It is a further advantage of the present invention that reflection, transmission and pictorial holograms made using the teachings provided herein can be switched on and off.

It is also an advantage of the present invention that switchable reflection gratings can be formed using positive and negative dielectric anisotropy liquid crystals.

These and other features and advantages of the present invention will become apparent as the description of certain representative embodiments proceeds.

BRIEF DESCRIPTION OF THE FIGURES

The present invention will be more clearly understood from a reading of the following detailed description in conjunction with the accompanying figures wherein:

FIGS. 14c and 14d are side views of the switchable half wave plate and crossed polarizers shown in FIG. 14b showing the effect of the application of a voltage to the plate whereby the polarization of the light is no longer rotated and thus blocked by the second polarizer;

FIG. 15a is a side view of a switchable subwavelength grating in accordance with the invention wherein the subwavelength grating functions as a quarter wave plate whereby plane polarized light is transmitted through the subwavelength grating, retroreflected by a mirror and reflected by the beam splitter;

FIG. 15b is a side view of the switchable subwavelength grating of FIG. 15a showing the effect of the application of a voltage to the plate whereby the polarization of the light is no longer modified, thereby permitting the reflected light to pass through the beam splitter;

DETAILED DESCRIPTION

Figure 1:
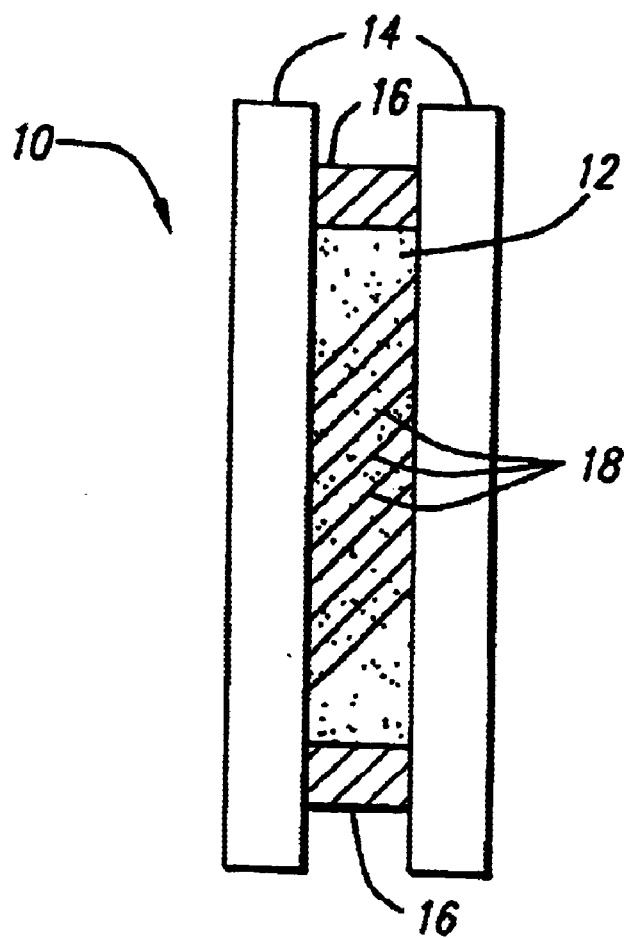
FIG. 1 is a cross-sectional view of an electrically switchable hologram made of an exposed polymer-dispersed liquid crystal material according to the teachings of the present invention.

In accordance with present invention there is provided a polymer dispersed liquid crystal ("PDLC") material comprising a monomer, a dispersed liquid crystal, a cross-linking monomer, a coinitiator and a photoinitiator dye. These PDLC materials exhibit clear and orderly separation of the liquid crystal and cured polymer, whereby the PDLC material advantageously provides high quality holographic gratings. The PDLC materials of the present invention are also advantageously formed in a single step. The present invention also utilizes a unique photopolymerizable prepolymer material that permits in situ control over characteristics of the resulting gratings, such as domain size, shape, density, ordering, and the like. Furthermore, methods and materials of the present invention can be used to prepare PDLC materials that function as switchable transmission or reflection gratings.

Polymer dispersed liquid crystal materials, methods, and devices contemplated for use in the practice of the present invention are also described in R. L. Sutherland et al., "Bragg Gratings in an Acrylate Polymer Consisting of Periodic Polymer-Dispersed Liquid-Crystal Planes," *Chemistry of Materials*, No. 5, pp. 1533–1538 (1993); in R. L. Sutherland et al., "Electrically switchable volume gratings in polymer-dispersed liquid crystals," *Applied Physics Letters*, Vol. 64, No. 9, pp. 1074–1076 (1984); and T. J. Bunning et al., "The Morphology and Performance of Holographic Transmission Gratings Recorded in Polymer Dispersed Liquid Crystals," *Polymer*, Vol. 36, No. 14, pp. 2699–2708 (1995), all of which are fully incorporated by reference into this Detailed Description. Copending patent applications Ser. Nos. 08/273,436 and 08/273,437 Sutherland et al., titled "Switchable Volume Hologram Materials and Devices," and "Laser Wavelength Detection and Energy Dosimetry Badge," respectively, also incorporated herein by reference include background material on the formation of transmission gratings inside volume holograms.

The process by which a hologram is formed according to the invention is controlled primarily by the choice of components used to prepare the homogeneous starting mixture, and to a lesser extent by the intensity of the incident light pattern. The preferred polymer-dispersed liquid crystal ("PDLC") material employed in the practice of the present invention creates a switchable hologram in a single step. A new feature of the preferred PDLC material is that illumination by an inhomogeneous, coherent light pattern initiates a patterned, anisotropic diffusion (or counter diffusion) of polymerizable monomer and second phase material, particularly liquid crystal ("LC") for this application. Thus, alternating well-defined channels of second phase-rich material, separated by well-defined channels of nearly pure polymer, are produced in a single-step process.

The resulting preferred PDLC material has an anisotropic spatial distribution of phase-separated LC droplets within the photochemically cured polymer matrix. Prior art PDLC materials made by a single-step process can achieve at best only regions of larger LC bubbles and smaller LC bubbles in a polymer matrix. The large bubble sizes are highly scattering which produces a hazy appearance and multiple order diffractions, in contrast to the well-defined first order diffraction and zero order diffraction made possible by the small LC bubbles of the preferred PDLC material in well-defined channels of LC-rich material. Reasonably well-defined alternately LC-rich channels and nearly pure polymer channels in a PDLC material are possible by multi-step processes, but such processes do not achieve the precise morphology control over LC droplet size and distribution of sizes and widths of the polymer and LC-rich channels made possible by the preferred PDLC material.

The sample is prepared by coating the mixture between two indium-tin-oxide (ITO) coated glass slides separated by spacers of nominally 10–20 $\mu$m thickness. The sample is placed in a conventional holographic recording setup. Gratings are typically recorded using the 488 nm line of an Argon ion laser with intensities of between about 0.1–100 mW/cm$^2$ and typical exposure times of 30–120 seconds. The angle between the two beams is varied to vary the spacing of the intensity peaks, and hence the resulting grating spacing of the hologram. Photopolymerization is induced by the optical intensity pattern. A more detailed discussion of exemplary recording apparatus can be found in R. L. Sutherland, et al., "Switchable holograms in new photopolymer-liquid crystal composite materials," Society of Photo-Optical Instrumentation Engineers (SPIE), Proceedings Reprint, Volume 2404, reprinted from *Diffractive and Holographic Optics Technology II* (1995), incorporated herein by reference.

The features of the PDLC material are influenced by the components used in the preparation of the homogeneous starting mixture and, to a lesser extent, by the intensity of the incident light pattern. In the preferred embodiment, the prepolymer material comprises a mixture of a photopolymerizable monomer, a second phase material, a photoinitiator dye, a coinitiator, a chain extender (or cross-linker), and, optionally, a surfactant.

In the preferred embodiment, the two major components of the prepolymer mixture are the polymerizable monomer and the second phase material, which are preferably completely miscible. Highly functionalized monomers are preferred because they form densely cross-linked networks which shrink to some extent and tend to squeeze out the second phase material. As a result, the second phase material is moved anisotropically out of jthe polymer region and, thereby, separated into well-defined polymer-poor, second phase-rich regions or domains. Highly functionalized monomers are also preferred because the extensive cross-linking associated with such monomers yields fast kinetics, allowing the hologram to form relatively quickly, whereby the second phase material will exist in domains of less than approximately 0.1 $\mu$m.

Highly functionalized monomers, however, are relatively viscous. As a result, these monomers do not tend to mix well with other materials, and they are difficult to spread into thin films. Accordingly, it is preferable to utilize a mixture of penta-acrylates in combination with di-, tri-, and/or tetra-acrylates in order to optimize both the functionality and viscosity of the prepolymer material. Suitable acrylates, such as triethyleneglycol diacrylate, trimethylolpropane triacrylate, pentaerythritol triacrylate, pentaerythritol tetracrylate, pentaerythritol pentacrylate, and the like can be used in accordance with the present invention. In the preferred embodiment, it has been found that an approximately 1:4 mixture of tri- to penta-acrylate facilitates homogeneous mixing while providing a favorable mixture for forming 10–20 μm films on the optical plates.

The second phase material of choice for use in the practice of the present invention is a liquid crystal. This also allows an electro-optical response for the resulting hologram. The concentration of LC employed should be large enough to allow a significant phase separation to occur in the cured sample, but not so large as to make the sample opaque or very hazy. Below about 20% by weight very little phase separation occurs and diffraction efficiencies are low. Above about 35% by weight, the sample becomes highly scattering, reducing both diffraction efficiency and transmission, Samples fabricated with approximately 25% by weight typically yield good diffraction efficiency and optical clarity. In prepolymer mixtures utilizing a surfactant, the concentration of LC may be increased to 35% by weight without loss in optical performance by adjusting the quantity of surfactant. Suitable liquid crystals contemplated for use in the practice of the present invention include the mixture of cyanobiphenyls marketed as E7 by Merck, 4'-n-pentyl-4-cyanobiphenyl, 4'-n-heptyl-4-cyanobiphenyl, 4-octaoxy-4-cyano biphenyl, 4'-pentyl-4-cyanoterphenyl, ∝-metloxybenylidene-4'-butylaniline, and the like. Other second phase components are also possible.

The preferred polymer-dispersed liquid crystal material employed in the practice of the present invention is formed from a prepolymer material that is a homogeneous mixture of a polymerizable monomer comprising dipentaerythritol hydroxypentacrylate (available, for example, from Polysciences, Inc., Warrington, Pa.), approximately 10–40 wt % of the liquid crystal E7 (which is a mixture of cyanobiphenyls marketed as E7 by Merck and also available from BDH Chemicals, Ltd., London, England), the chain-extending monomer N-vinylpryrrolidone ("NVP") (available from the Aldrich Chemical Company, Milwaukee, Wis.), coinitiator N-phenylgylycine ("NPG") (also available from the Aldrich Chemical Company, Milwaukee., Wis.), and the photoinitiator dye rose bengal ester; (2,4,5,7-tetraiodo-3',4',5',6'-tetrachlorofluroescein-6-acetate ester) marketed as RBAX by Spectragraph, Ltd., Maumee, Ohio). Rose bengal is also available as rose bengal sodium salt (which must be esterfied for solubility) from the Aldrich Chemical Company.

This system has a very fast curing speed which results in the formation of small liquid crystal micro-droplets.

The mixture of liquid crystal and prepolymer material are homogenized to a viscous solution by suitable means (e.g., ultrasonification) and spread between indium-tin-oxide ("ITO") coated glass slides with spacers of nominally 15–100 μm thickness and, preferably, 10–20 μm thickness. The ITO is electrically conductive, and serves as an optically transparent electrode. Preparation, mixing and transfer of the prepolymer material onto the glass slides are preferably done in the dark as the mixture is extremely sensitive to light.

The sensitivity of the prepolymer materials to light intensity is dependent on the photoinitiator dye and its concentration. A higher dye concentration leads to a higher sensitivity. In most cases, however, the solubility of the photoinitiator dye limits the concentration of the dye and, thus, the sensitivity: of the prepolymer material. Nevertheless, it has been found that for more general applications photoinitiator dye concentrations in the range of 0.2–0.4% by weight are sufficient to achieve desirable sensitivities and allow for a complete bleaching of the dye in the recording process, resulting in colorless final samples. Photoinitiator dyes that are useful in generating PDLC materials in accordance with the present invention are rose bengal ester (2,4,5,7-tetraiodo-3',4',5',6'-tetrachlorofluroescein-6-acetate ester); rose bengal sodium salt; eosin; eosin sodium salt; 4,5-diiodosuccinyl fluorescein; camphorquinone; methylene blue, and the like. These dyes allow a sensitivity to recording wavelengths across the visible spectrum from nominally 400 nm to 700 nm. Suitable near-infrared dyes, such as cationic cyanine dyes with trialkylborate anions having absorption from 600–900 nm as well as merocyanine dyes derived from spiropyran should also find utility in connection with the present invention.

The coinitiator employed in the practice of the present invention controls the rate of curing in the free radical polymerization reaction of the prepolymer material. Optimum phase separation and, thus, optimum diffraction efficiency in the resulting PDLC material, are a function of curing rate. It has been found that favorable results can be achieved utilizing coinitiator in the range of 2–3% by weight. Suitable coinitiators include N-phenyl glycine; triethylene amine; triethanolamine; N,N-dimethyl-2,6-diisopropyl aniline, and the like.

Other suitable dyes and dye coinitiator combinations that should be suitable for use in the present invention, particularly for visible light, include eosin and triethanolamine; camphorquinone and N-phenyglycine; fluorescein and triethanolamine; methylene blue and triethanolamine or N-phenylglycine; erythrosin B and triethanolamine; indolinocarbocyanine and triphenyl borate; iodobenzospiropyran and triethylamine, and the like.

The chain extender (or cross linker) employed in the practice of the present invention helps to increase the solubility of the components in the prepolymer material as well as increase the speed of polymerization. The chain extender is preferably a smaller vinyl monomer as compared with the pentacrylate, whereby it can react with the aerylate positions in the pentaacrylate monomer, which are not easily accessible to neighboring pentaacrylate monomers due to steric hindrance. Thus, reaction of the chain extender monomer with the polymer increases the propagation length of the growing polymer and results in high molecular weights. It has been found that chain extender in general applications in the range of 10–18% by weight maximizes the performance in terms of diffraction efficiency. In the preferred embodiment, it is expected that suitable chain extenders can be selected from the following: N-vinyl pyrrolidone; N-vinyl pyridine; acrylonitrile; N vinyl carbazole, and the like.

It has been found that the addition of a surfactant material, namely, octanoic acid, in the prepolymer material lowers the switching voltage and also improves the diffraction efficiency. In particular, the switching voltage for PDLC materials containing a surfactant are significantly lower than those of a PDLC material made without the surfactant. While not wishing to be bound by any particular theory, it is believed that these results may be attributed to the weakening of the anchoring forces between the polymer and the phase-separated LC droplets. SEM studies have shown that droplet sizes in PDLC materials including surfactants are reduced to the range of 30–50 nm and the distribution is more homogeneous. Random scattering in such materials is reduced due to the dominance of smaller droplets, thereby increasing the diffraction efficiency. Thus, it is believed that the shape of the droplets becomes more spherical in the presence of surfactant, thereby contributing to the decrease in switching voltage.

For more general applications, it has been found that samples with as low as 5t by weight of surfactant exhibit a significant reduction in switching voltage. It has also been found that, when optimizing for low switching voltages, the concentration of surfactant may vary up to about 10% by weight (mostly dependent on LC concentration) after which there is a large decrease in diffraction efficiency, as well as an increase in switching voltage (possibly due to a reduction in total phase separation of LC). Suitable surfactants include octanoic acid; heptanoic acid; hexanoic acid; dodecanoic acid; decanoic acid, and the like.

In samples utilizing octanoic acid as the surfactant, it has been observed that the conductivity of the sample is high, presumably owing to the presence of the free carboxyl is (COOH) group in the octanoic acid. As a result, the sample increases in temperature when a high frequency (~2 KHz) electrical field is applied for prolonged periods of time. Thus, it is desirable, to reduce the high conductivity introduced by the surfactant, without sacrificing the high diffraction efficiency and the low switching voltages. It has been found that suitable electrically switchable gratings can be formed from a polymerizable monomer, vinyl neononanoate ("VN") $C_8H_{17}CO_2$ CH=$CH_2$, commercially available from the Aldrich Chemical Co. in Milwaukee, Wis. Favorable results have also been obtained where the chain extender N-vinyl pyrrolidone ("NVP") and the surfactant octanoic acid are replaced by 6.5% by weight VN. VN also acts as a chain extender due to the presence of the reactive acrylate monomer group. In these variations, high optical quality samples were obtained with about 70% diffraction efficiency, and the resulting gratings could be electrically switched by an applied field of 6V/$\mu$m.

PDLC materials in accordance with the present invention may also be formed using a liquid crystalline bifunctional acrylate as the monomer ("LC monomer"). The LC monomers have an advantage over conventional acrylate monomers due to their high compatibility with the low molecular weight nematic LC materials, thereby facilitating formation of high concentrations of low molecular weight LC and yielding a sample with high optical quality. The presence of higher concentrations of low molecular weight LCS in the PDLC material greatly lowers the switching voltages (e.g., to ~2V/gm). Another advantage of using LC monomers is that it is possible to apply low AC or DC fields while recording holograms to pre-align the host LC monomers and low molecular weight LC so that a desired orientation and configuration of the nematic directors can be obtained in the LC droplets. The chemical formulae of several suitable LC monomers are as follows:

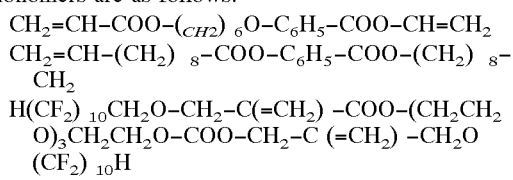

Semifluorinated polymers are known to show weaker anchoring properties and also significantly reduced switching fields. Thus, it is believed that semifluorinated acrylate monomers which are bifunctional and liquid crystalline will find suitable application in the present invention.

Referring now to FIG. 1 of the drawings, there is shown a cross-sectional view of an electrically switchable hologram 10 made of an exposed polymer-dispersed liquid crystal material according to the teachings of the present invention. A layer 12 of the polymer-dispersed liquid crystal material is sandwiched between a pair of indium-tin-oxide (ITO) coated glass slides 14 and spacers 16. The interior of hologram 10 shows the Bragg transmission gratings 18 formed when layer 12 was exposed to an interference pattern from two intersecting beams of coherent laser light. The exposure times and intensities can be varied depending on the diffraction efficiency and liquid crystal domain size desired. Liquid crystal domain size can be controlled by varying the concentrations of photoinitiator, coinitiator and chain-extending (or cross-linking) agent. The orientation of the nematic directors can be controlled while the gratings are being recorded by application of an external electric field across the ITO electrodes.

Figure 2:
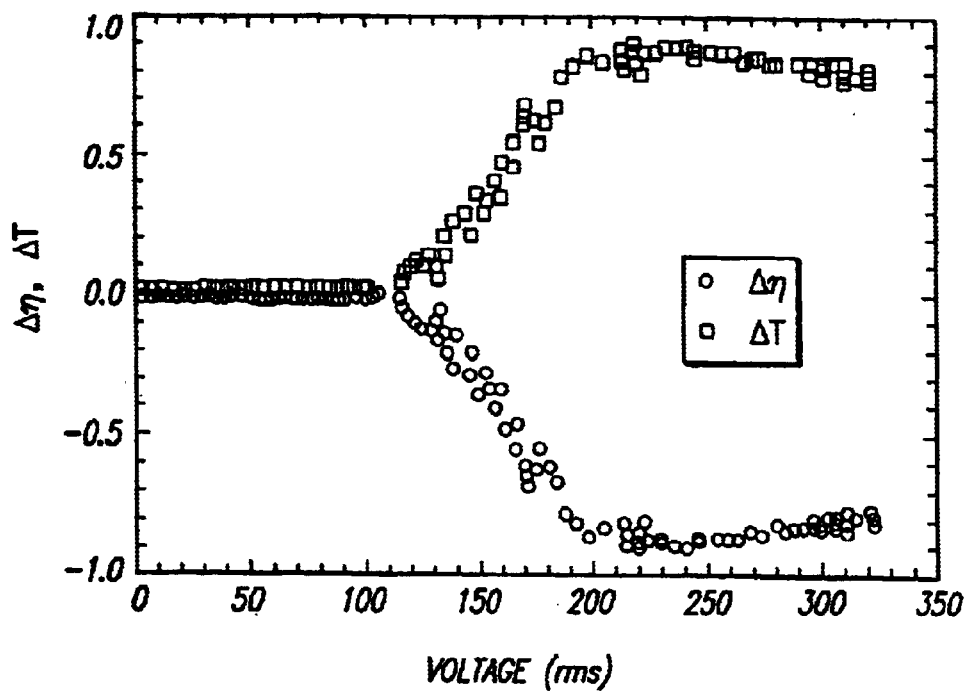
FIG. 2 is a graph of the normalized net transmittance and normalized net diffraction efficiency of a hologram made according to the teachings of the present invention (without the addition of a surfactant) versus the rms voltage applied across the hologram.

The scanning electron micrograph shown in FIG. 2 of the referenced *Applied Physics Letters* article and incorporated herein by reference is of the surface of a grating which was recorded in a sample with a 36 wt % loading of liquid crystal using the 488 nm line of an argon ion laser at an intensity of 95 mW/$cm^2$. The size of the liquid crystal domains is about 0.2 $\mu$m and the grating spacing is about 0.54 $\mu$m. This sample, which is approximately 20 $\mu$m thick, diffracts light in the Bragg regime.

FIG. 2 is a graph of the normalized net transmittance and normalized net diffraction efficiency of a hologram made according to the teachings of the present invention-versus the root mean square voltage ("Vrms") applied across the hologram. $\Delta\eta$ is the change in first order Bragg diffraction efficiency. $\Delta T$ is the change in zero order transmittance. FIG. 2 shows that energy is transferred from the first order beam to the zero-order beam as the voltage is increased. There is a true minimum of the diffraction efficiency at approximately 225 Vrms. The peak diffraction efficiency can approach 100%, depending on the wavelength and polarization of the probe beam, by appropriate adjustment of the sample thickness. The minimum diffraction efficiency can be made to approach 0% by slight adjustment of the parameters of the PDLC material to force the refractive index of the cured polymer to be equal to the ordinary refractive index of the liquid crystal.

Figure 3:
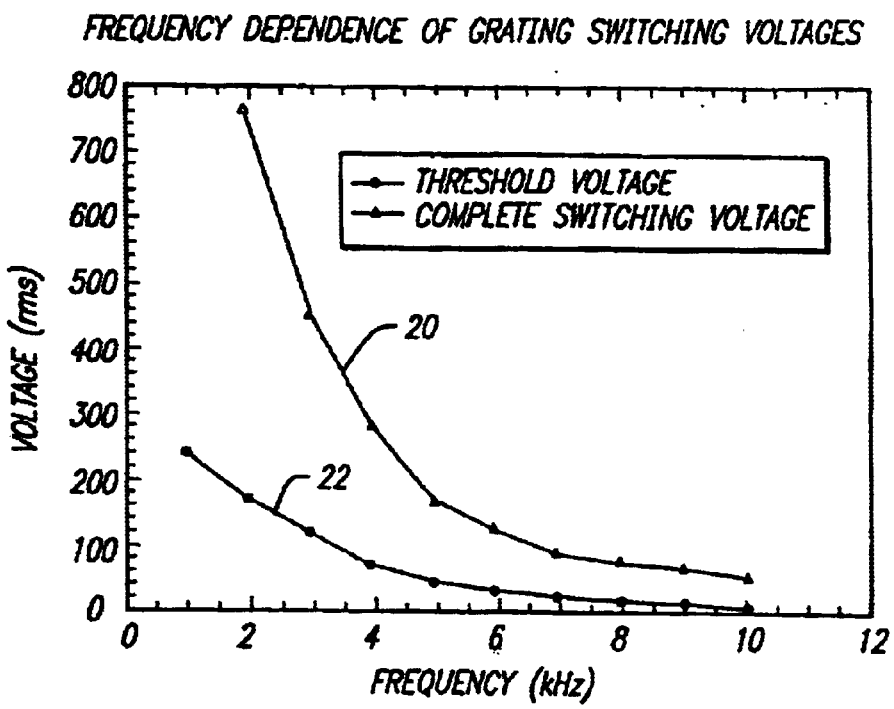
FIG. 3 is a graph of both the threshold and complete switching rms voltages needed for switching a hologram made according to the teachings of the present invention to minimum diffraction efficiency versus the frequency of the rms voltage.

By increasing the frequency of the applied voltage, the switching voltage for minimum diffraction efficiency can be decreased significantly. This is illustrated in FIG. 3, which is a graph of both the threshold rms voltage 20 and the complete switching rms voltage 22 needed for switching a hologram made according to the teachings of the present invention to minimum diffraction efficiency versus the frequency of the rms voltage. The threshold and complete switching rms voltages are reduced to 20 Vrms and 60 Vrms, respectively, at 10 kHz. Lower values are expected at even higher frequencies.

Figure 4:
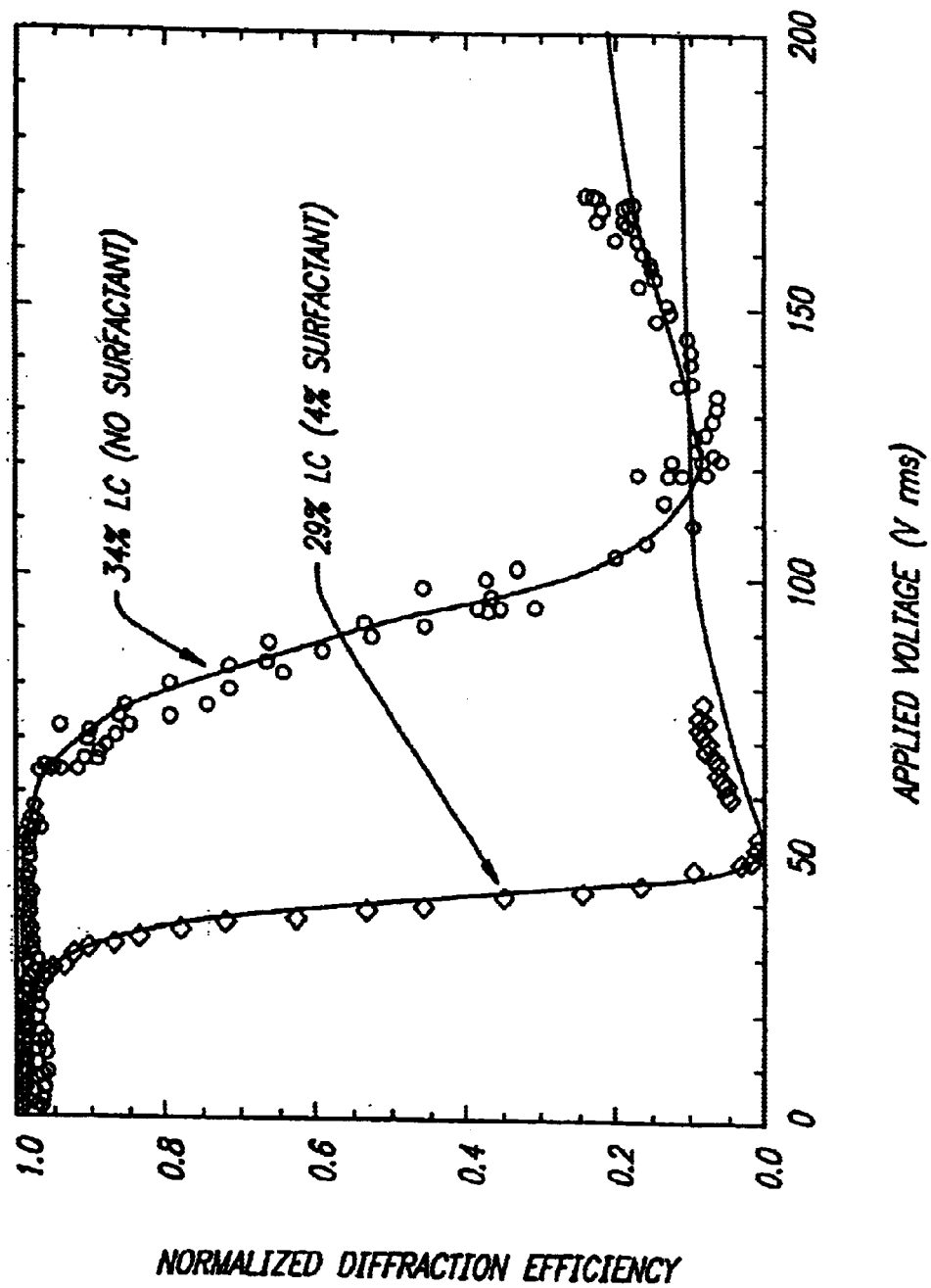
FIG. 4 is a graph of the normalized diffraction efficiency as a function of the applied electric field for a PDLC material formed with 34% by weight liquid crystal without surfactant present and a PDLC material formed with 29% by weight liquid crystal and 4% by weight surfactant.
Figure 5:
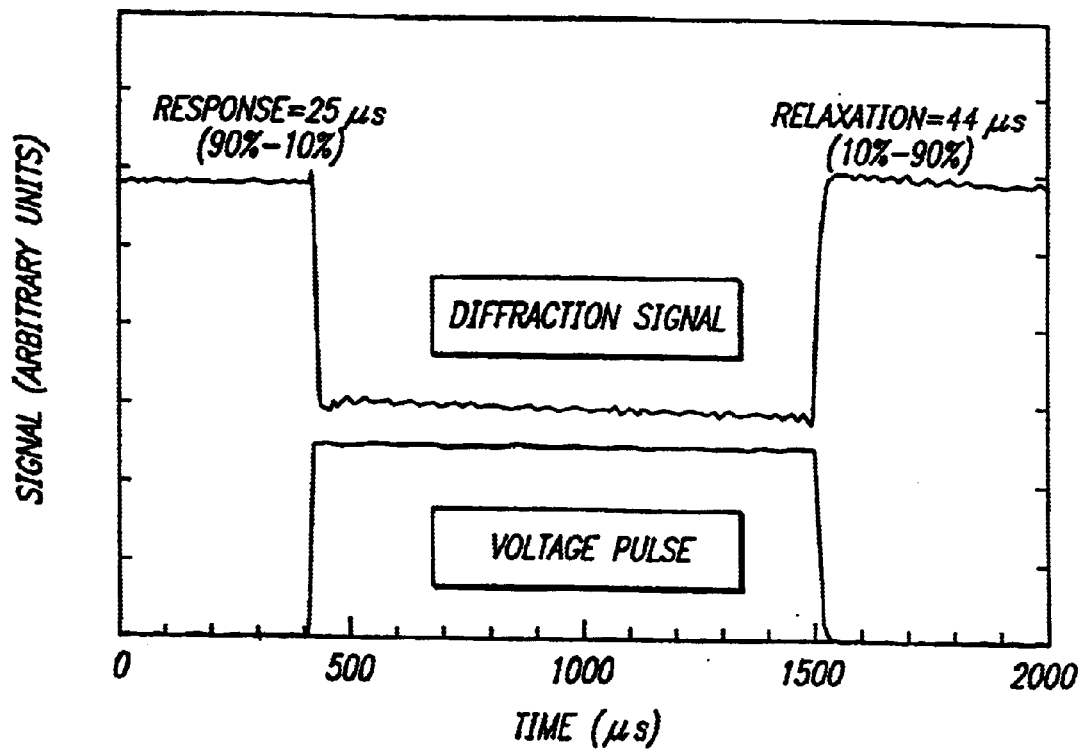
FIG. 5 is a graph showing the switching response time data for the diffracted beam in the surfactant-containing PDLC material in FIG. 5.

Smaller liquid crystal droplet sizes have the problem that it takes high switching voltages to switch their orientation. As described in the previous paragraph, using alternating current switching voltages at high frequencies helps reduce the needed switching voltage. As demotrated in FIG. 4, another unique discovery of the present invention is that adding a surfactant (e.g., octanoic acid) to the prepolymer material in amounts of about 4%–6% by weight of the total mixture resulted in sample holograms with switching voltages near 50 Vrms at lower frequencies of 1–2 kHz. As shown in FIG. 5, it has also been found that the use of the surfactant with the associated reduction in droplet size, reduces the switching time of the PDLC materials. Thus, samples made with surfactant can be switched on the order of 25–44 microseconds. Without wishing to be bound by any theory, the surfactant is believed to reduce switching voltages by reducing the anchoring of the liquid crystals at the interface between liquid crystal and cured polymer.

Figure 6:
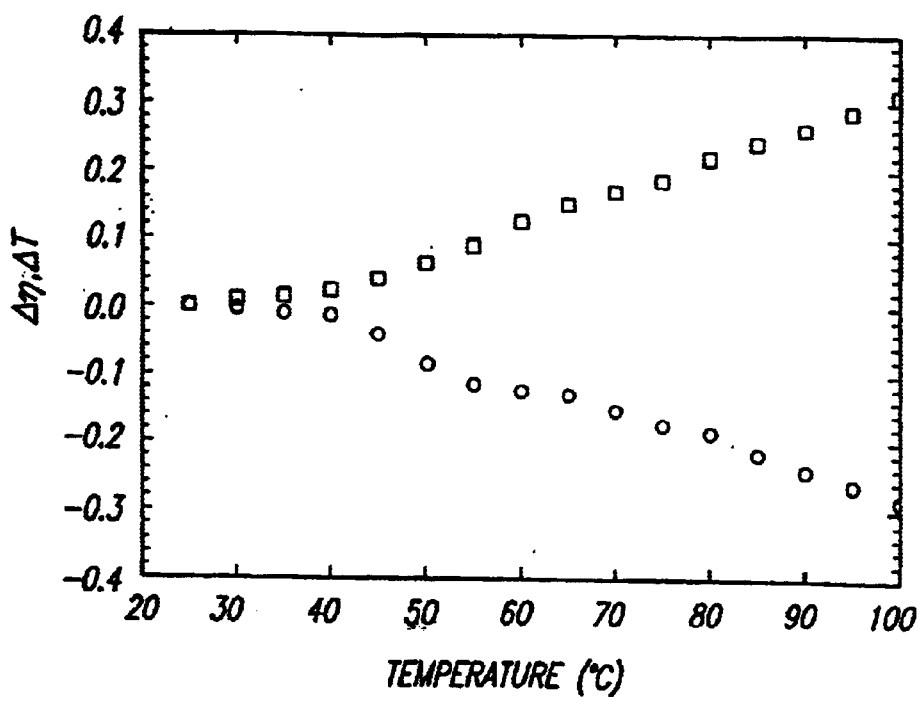
FIG. 6 is a graph of the normalized net transmittance and the normalized net diffraction efficiency of a hologram made according to the teachings of the present invention versus temperature.

Thermal control of diffraction efficiency is illustrated in FIG. 6. FIG. 6 is a graph of the normalized net transmittance and normalized net diffraction efficiency of a hologram made according to the teachings of the present invention versus temperature.

The polymer-dispersed liquid crystal materials described herein successfully demonstrate the utility for recording volume holograms of a particular composition for such polymer-dispersed liquid crystal systems. Although the disclosed polymer-dispersed liquid crystal systems are specialized, the present invention will find application in other areas where a fast curing polymer and a material that can be phase-separated from the polymer will find use.

Figure 7:
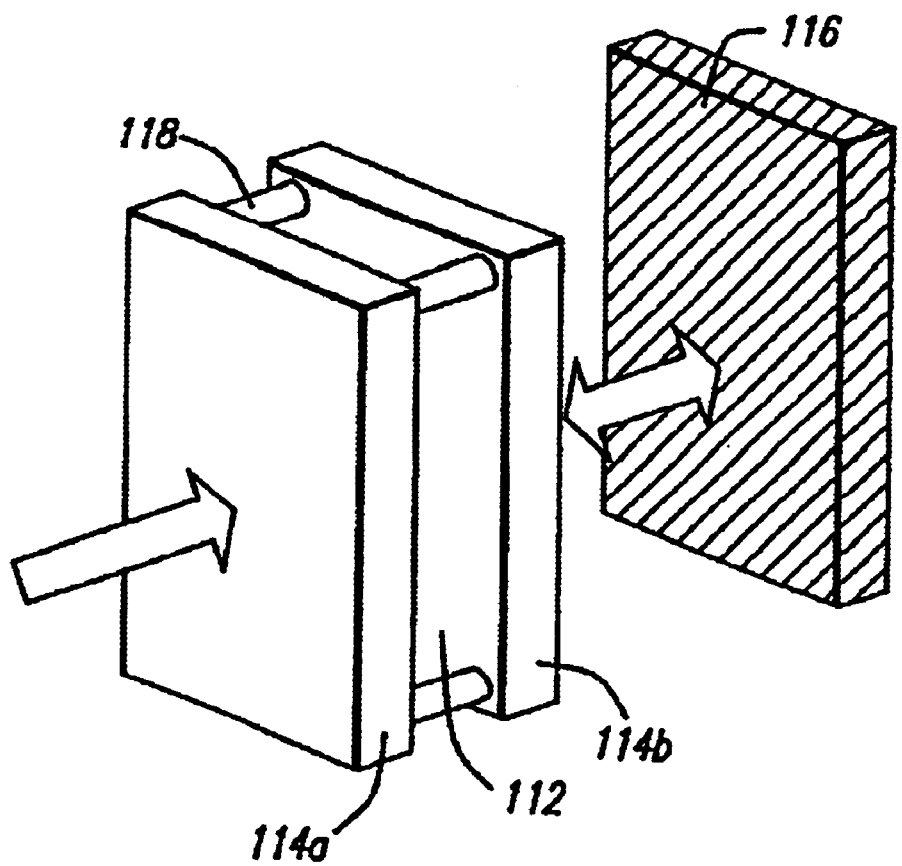
FIG. 7 is an elevational view of a typical experimental arrangement for recording reflection gratings.

As shown in FIG. 7, a PDLC reflection grating is prepared by placing several drops of the mixture of prepolymer material 112 on an indium-tin oxide ("ITO") coated glass slide 114a. A second indium-tin oxide ("ITO") coated slide 114b is then pressed against the first, thereby causing the prepolymer material 112 to fill the region between the slides 114a and b. Preferably, the separation of the slides is maintained at approximately 20 $\mu$m by utilizing uniform spacers 118. Preparation, mixing and transfer of the prepolymer material is preferably done in the dark. Once assembled, a mirror 116 is placed directly behind the glass plate 114b. The distance of the mirror from the sample is preferably substantially shorter than the coherence length of the laser. The PDLC material is preferably exposed to the 488 nm line of an argon-ion laser, expanded to fill the entire plane of the glass plate, with an intensity of approximately 0.1–100 mWatts/cm$^2$ with typical exposure times of 30–120 seconds. Constructive and destructive interference within the expanded beam establishes a periodic intensity profile through the thickness of the film.

In the preferred embodiment, the prepolymer material utilized to make a reflection grating comprises a monomer, a liquid crystal, a cross-linking monomer, a coinitiator, and a photoinitiator dye. In the preferred embodiment, the reflection grating is formed from prepolymer material comprising by total weight of the monomer dipentaerythritol hydroxypentacrylate ("DPHA"), 34% by total weight of a liquid crystal comprising a mixture of cyano biphenyls (known commercially as "E7"), 10% by total weight of a cross-linking monomer comprising N-vinylpyrrolidone ("NVP"), 2.5% by weight of the coinitiator N-phenylglycine ("NPG"), and 10$^{-5}$ to 10$^{-6}$ gram moles of a photoinitiator dye comprising rose bengal ester. Further, as with transmission gratings, the addition of surfactants is expected to facilitate the same advantageous properties discussed above in connection with transmission gratings. It is also expected that similar ranges and variation of prepolymer starting materials will find ready application in the formation of suitable reflection gratings.

It has been determined by low voltage, high resolution scanning electron microscopy ("LVHRSEM") that the resulting material comprises a fine grating with a periodicity of 165 nm with the grating vector perpendicular to the plane of the surface. Thus, as shown schematically in FIG. 8a, grating 130 includes periodic planes of polymer channels 130a and PDLC channels 130b which run parallel to the front surface 134. The grating spacing associated with these periodic planes remains relatively constant throughout the full thickness of the sample from the air/film to the film/substrate interface.

Although interference is used to prepare both transmission and reflection gratings, the morphology of the reflection grating differs significantly. In particular, it has been determined that unlike transmission gratings with similar liquid crystal concentrations, very little coalescence of individual droplets was evident. Furthermore, the droplets that were present in the material were significantly smaller, having diameters between 50 and 100 nm. Furthermore, unlike transmission gratings where the liquid crystal-rich regions typically comprise less than 40% of the grating, the liquid crystal-rich component of a reflection grating is significantly larger. Due to the much smaller periodicity associated with reflection gratings, i.e., a narrower grating spacing (~0.2 microns), it is believed that the time difference between completion of curing in high intensity versus low intensity regions is much smaller. Thus, gelation occurs more quickly and droplet growth is minimized. It is also believed that the fast polymerization, as evidenced by small droplet diameters, traps a significant percentage of the liquid crystal in the matrix during gelation and precludes any substantial growth of large droplets or diffusion of small droplets into larger domains.

Analysis of the reflection notch in the absorbance spectrum supports the conclusion that a periodic refractive index modulation is disposed through the thickness of the film. In PDLC materials that are formed with the 488nm line of an argon ion laser, the reflection notch typically has a reflection wavelength at approximately 472 nm for normal incidence and a relatively narrow bandwidth. The small difference between the writing wavelength and the reflection wavelength (approximately 5%) indicates that shrinkage of the film is not a significant problem. Moreover, it has been found that the performance of such gratings is stable over periods of many months.

In addition to the materials utilized in the preferred embodiment described above, it is believed that suitable PDLC materials could be prepared utilizing monomers such as triethyleneglycol diacrylate, trimethylolpropanetriacrylate, pentaerythritol triacrylate, pentaerythritol tetracrylate, pentaerythritol pentacrylate, and the like. Similarly, other coinitiators such as triethylamine, triethanolamine, N,N-dimethyl-2,6-diisopropylaniline, and the like could be used instead of N-phenylslycLine. Where it is desirable to use the 458 nm, 476 nm, 488 nm or 514 nm lines of an Argon ion laser, that the photoinitiator dyes rose bengal sodium salt, eosin, eosin sodium salt, fluorescein sodium salt and the like will give favorable results. Where the 633 nm line is utilized, methylene blue will find ready application. Finally, it is believed that other liquid crystals, such as 4'-pentyl-4-cyanobiphenyl or 4'-heptyl-4-cyanobiphenyl, can be utilized in accordance with the invention.

Figure 8B:
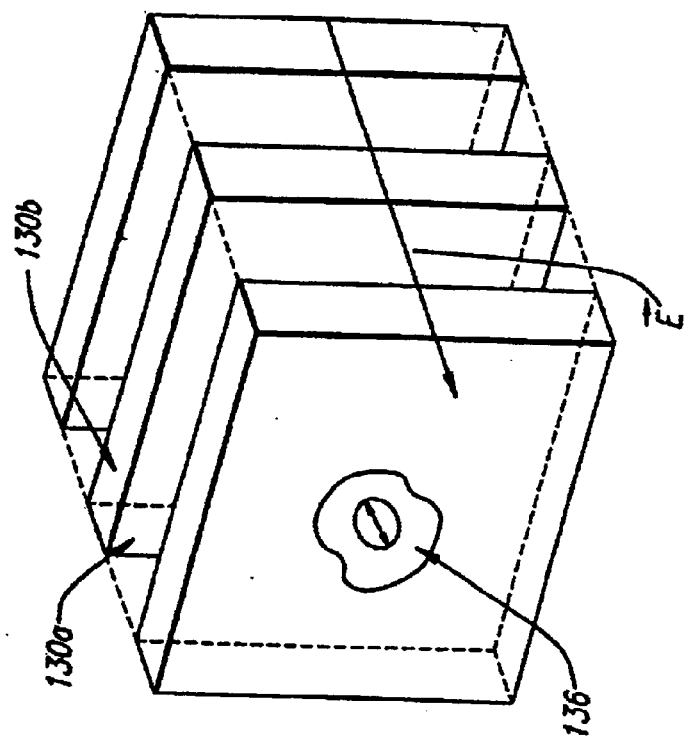
FIGS. 8a and 8b are elevational views of a reflection grating in accordance with the present invention having periodic planes of polymer channels and PDLC channels disposed parallel to the front surface in the absence of a field (FIG. 8a) and with an electric field applied (FIG. 8b) wherein the liquid-crystal utilized in the formation of the grating has a positive dielectric anisotropy.
Figure 8A:
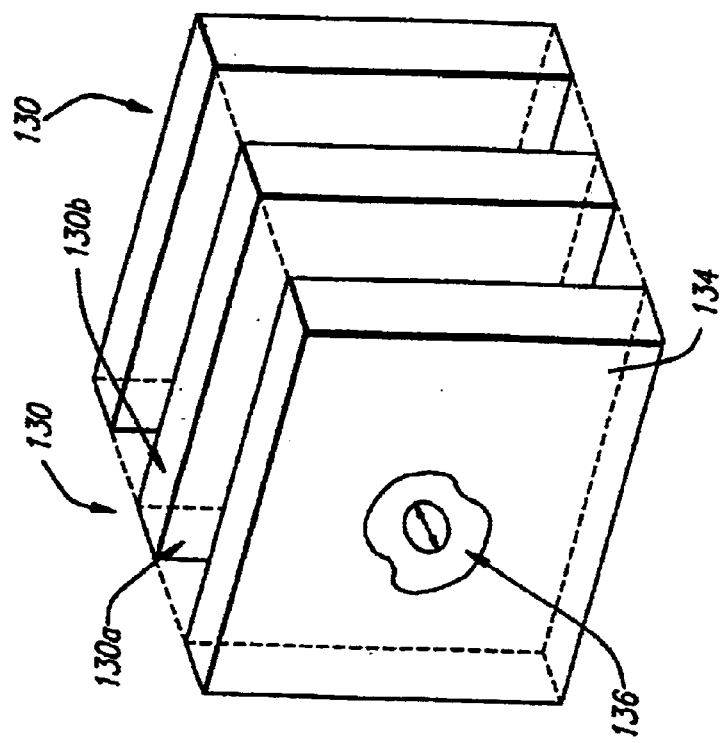

Referring again to FIG. 8a, there is shown an elevational view of a reflection grating 130 in accordance with the invention having periodic planes of polymer channels 130a and PDLC channels 130b disposed parallel to the front surface 134 of the grating 130. The symmetry axis 136 of the liquid crystal domains is formed in a direction perpendicular to the periodic channels 130a and 130b of the grating 130 and perpendicular to the front surface 134 of the grating 130. Thus, when an electric flield E is applied, as shown in FIG. 8b, the symmetry axis 136 is already in a low energy state in alignment with the field E and will not reorient. Thus, reflection gratings formed in accordance with the procedure described above will not normally be switchable.

In general, a reflection grating tends to reflect a narrow wavelength band, such that the grating can be used as a reflection filter. In the preferred embodiment, however, the reflection grating is formed so that it will be switchable. In accordance with the present invention, switchable reflection gratings can be made utilizing negative dielectric anisotropy LCs (or LCs with a low cross-over frequency), an applied magnetic field, an applied shear stress field, or slanted gratings.

Figure 9B:
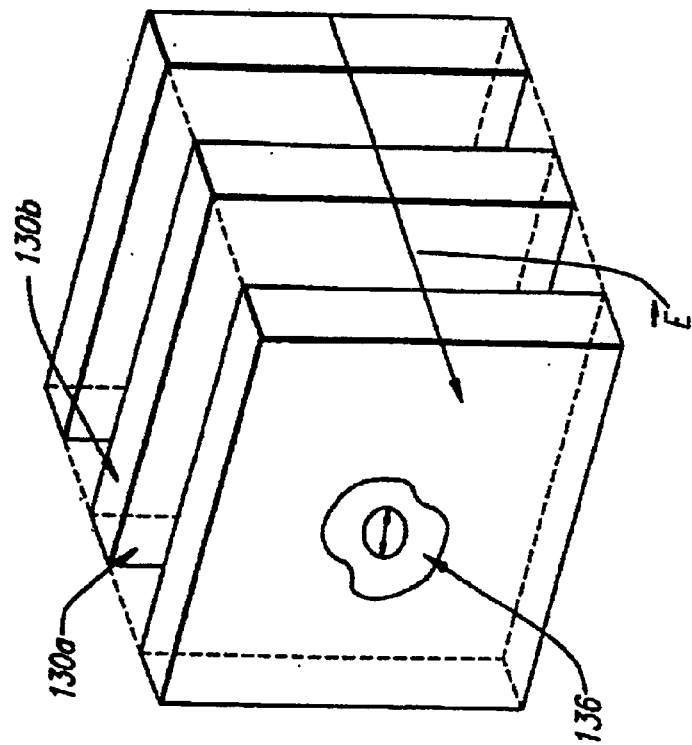
FIGS. 9a and 9b are elevational views of a reflection grating in accordance with the invention having periodic planes of polymer channels and PDLC channels disposed parallel to the front surface of the grating in the absence of an electric field (FIG. 9a) and with an electric field applied (FIG. 9b) wherein the liquid crystal utilized in the formation of the grating has a negative dielectric anisotropy.
Figure 9A:
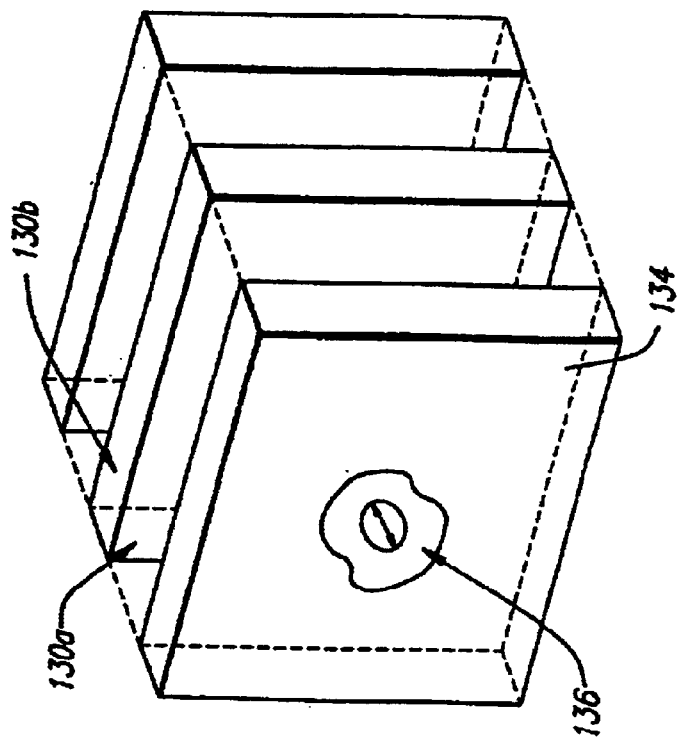

It is known that liquid crystals having a negative dielectric anisotropy ($\Delta\epsilon$) will rotate in a direction perpendicular to an applied field. As shown in FIG. 9a, the symmetry axis 136 of the liquid crystal domains formed with a liquid crystal having a negative $\Delta\epsilon$ will also be disposed in a direction perpendicular to the periodic channels 130a and 130b of the grating 130 and to the front surface 134 of the grating. However, when an electric field E is applied across such gratings, as shown in FIG. 9b, the symmetry axis of the negative $\Delta\epsilon$ liquid crystal will distort and reorient in a direction perpendicular to the field E, which is perpendicular to the film and the periodic planes of the grating. As a result, the reflection grating can be switched between a state where it is reflective and a state where it is transmissive. The following negative $\Delta\epsilon$ liquid crystals and others are expected to find ready application in the methods and devices of the present invention:

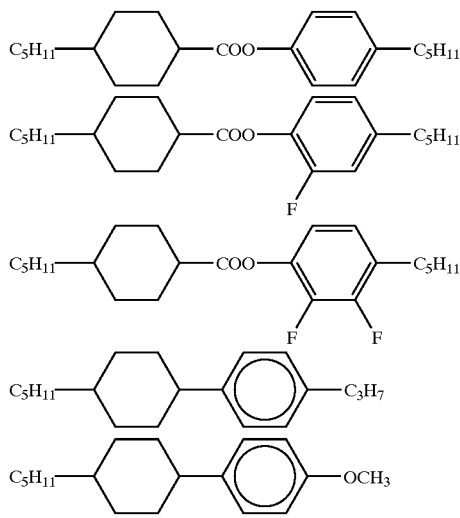

Liquid crystals can be found in nature (or synthesized) with either positive or negative $\Delta\epsilon$. Thus, in more detailed aspects of the inventions, it is possible to use a LC which has a positive $\Delta\epsilon$ at low frequencies, but becomes negative at high frequencies. The frequency (of the applied voltage) at which $\Delta\epsilon$ changes sign is called the cross-over frequency. The cross-over frequency will vary with LC composition, and typical values range from 1–10 kHz. Thus, by operating at the proper frequency, the reflection grating may be switched. In accordance with the invention, it is expected that low crossover frequency materials can be prepared from a combination of positive and negative dielectric anisotropy liquid crystals. A suitable positive dielectric liquid crystal for use in such, a combination contains four ring esters as shown below:

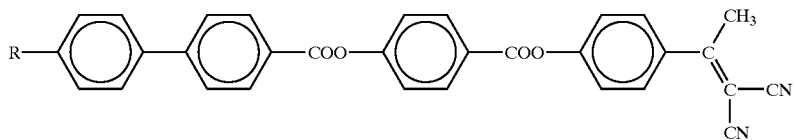

A strongly negative dielectric liquid crystal suitable for use in such a combination is made up of pyridazines as shown below:

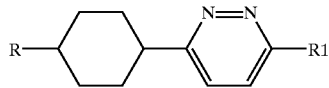

Both liquid crystal materials are available from LaRoche & Co., Switzerland. By varying the proportion of the positive and negative liquid crystals in the combination, crossover frequencies from 1.4–2.3 kHz are obtained at room temperature. Another combination suitable for use in the present embodiment is a combination of the following: p-pentylphenyl-2-chloro- 4-(p-pentylbenzoyloxy) benzoate and -4-(p-pentylbenzoyloxy,) benzoate and p-heptylphenyl-2-chloro-4-(p-octylbenzoyloxy) benzoate. These materials are available from Kodak Company.

Figure 10A:
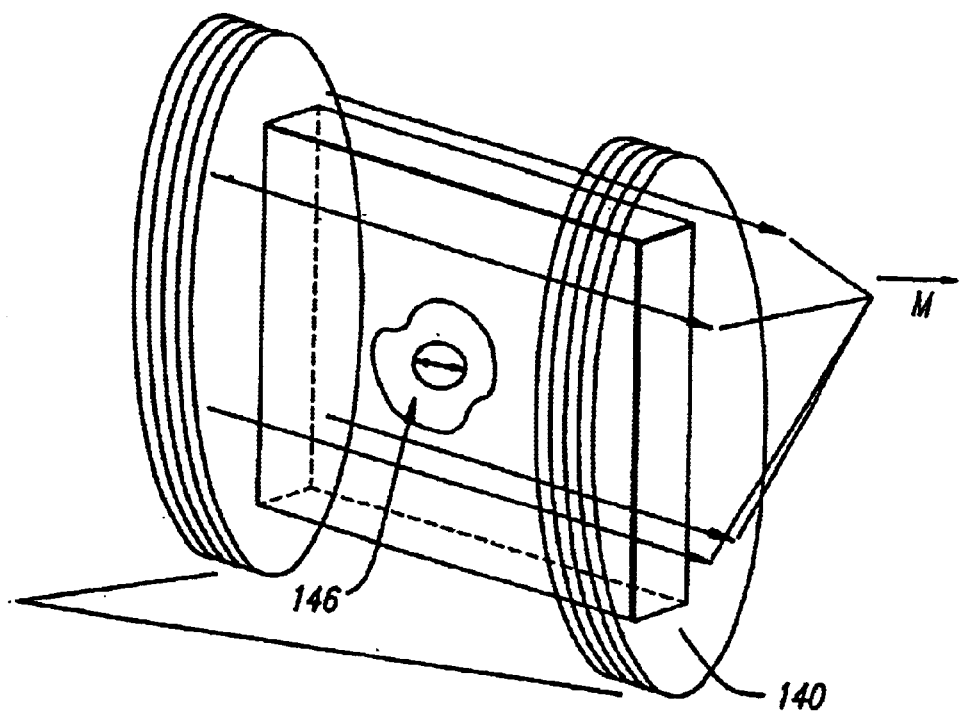
FIG. 10a is an elevational view of a reflection grating in accordance with the invention disposed within a magnetic field generated by Helmholtz coils.
Figure 10B:
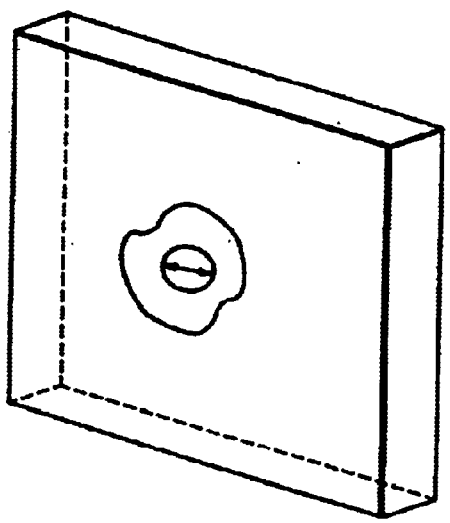
FIGS. 10b and 10c are elevational views of the reflection grating of FIG. 10a in the absence of an electric field (FIG. 10b) and with an electric field applied (FIG. 10c)
Figure 10C:
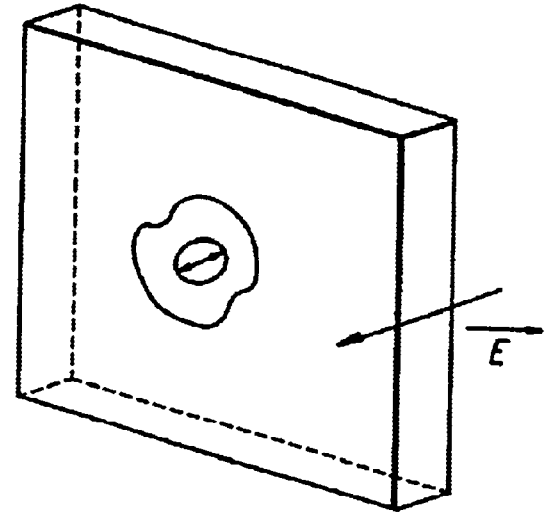

In still more detailed aspects of the invention, switchable reflection gratings can be formed using positive $\Delta\epsilon$ liquid crystals. As shown in FIG. 10a, such gratings are formed by exposing the PDLC starting material to a magnetic field during the curing process. The magnetic field can be generated by the use of Helmholtz coils (as shown in FIG. 10a), the use of a permanent magnet, or other suitable means. Preferably, the magnetic field M is oriented parallel to the front surface of the glass plates (not shown) that are used to form the grating 140. As a result, the symmetry axis 146 of the liquid crystals will orient along the field while the mixture is fluid. When polymerization is complete, the field may be removed and the alignment of the symmetry axis of the liquid crystals will remain unchanged. (See FIG. 10b) When an electric field is applied, as shown in FIG. 10c, the positive $\Delta\epsilon$ liquid crystal will reorient in the direction of the field, which is perpendicular to the front surface of grating and to the periodic channels of the grating.

Figure 11A:
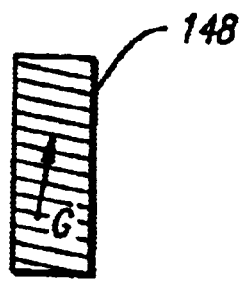
FIGS. 11a and 11b are representative side views of a slanted transmission grating (FIG. 11a) and a slanted reflection grating (FIG. 11b) showing the orientation of the grating vector G of the periodic planes of polymer channels and PDLC channels.
Figure 11B:
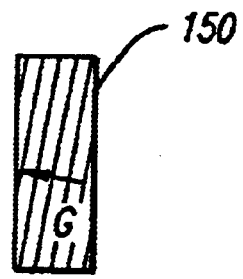

FIG. 11a depicts a slanted transmission grating 148 and FIG. 11b depicts a slanted reflection grating 150. A holographic transmission grating is considered slanted if the direction of the grating vector G is not parallel to the grating surface. In a holographic reflection grating, the grating is said to be slanted if the grating vector G is not perpendicular to the grating surface. Slanted gratings have many of the same uses as nonslanted gratings such as visual displays, mirrors, line filters, optical switches, and the like.

Primarily, slanted holographic gratings are used to control the direction of a diffracted beam. For example, in reflection holograms a slanted grating is used to separate the specular reflection of the film from the diffracted beam. In a PDLC holographic grating, a slanted grating has an even more useful advantage. The slant allows the modulation depth of the grating to be controlled by an electric field when using either tangential or homeotropic aligned liquid crystals. This is because the slant provides components of the electric field in the directions both tangent and perpendicular to the grating vector. In particular, for the reflection grating, the LC domain symmetry axis will be oriented along the grating vector G and can be switched to a direction perpendicular to the film plane by a longitudinally applied field E. This is the typical geometry for switching of the diffraction efficiency of a slanted reflection grating.

When recording slanted reflection gratings, it is desirable to place the sample between the hypotenuses of two right-angle glass prisms.; Neutral density filters can then be placed in optical contact with the back faces of the prisms using index matching fluids so as to frustrate back reflections which would cause spurious gratings to also be recorded. The incident laser beam is split by a conventional beam splitter into two beams which are then directed to the front faces of the prisms and then overlapped in the sample at the desired angle. The beams thus enter the sample from opposite sides. This prism coupling technique permits the light to enter the sample at greater angles. The slant of the resulting grating is determined by the angle which the prism assembly is rotated (i.e., the angle between the direction of one incident beam and the normal to the prism front face at which that beam enters the prism).

Figure 12:
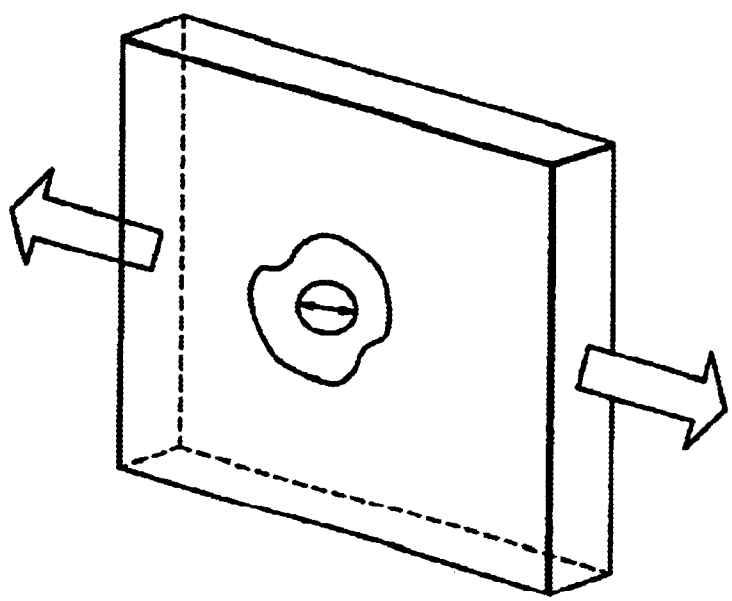
FIG. 12 is an elevational view of a reflection grating formed in accordance with the invention while a shear stress field is applied.

As shown in FIG. 12, switchable reflection gratings may be formed in the presence of an applied shear stress field. In this method, a shear stress would be applied along the direction of a magnetic field M. This could be accomplished, for example, by applying equal and opposite tensions to the two ITO coated glass plates which sandwich the prepolymer mixture while the polymer is still soft. This shear stress would distort the LC domains in the direction of the stress, and the resultant LC domain symmetry axis will be preferentially along the direction of the stress, parallel to the PDLC planes and perpendicular to the direction of the applied electric field for switching.

Reflection gratings prepared in accordance with the teachings of the present invention will find application in color reflective displays, switchable wavelength filters for laser protection, and the like.

Figure 13:
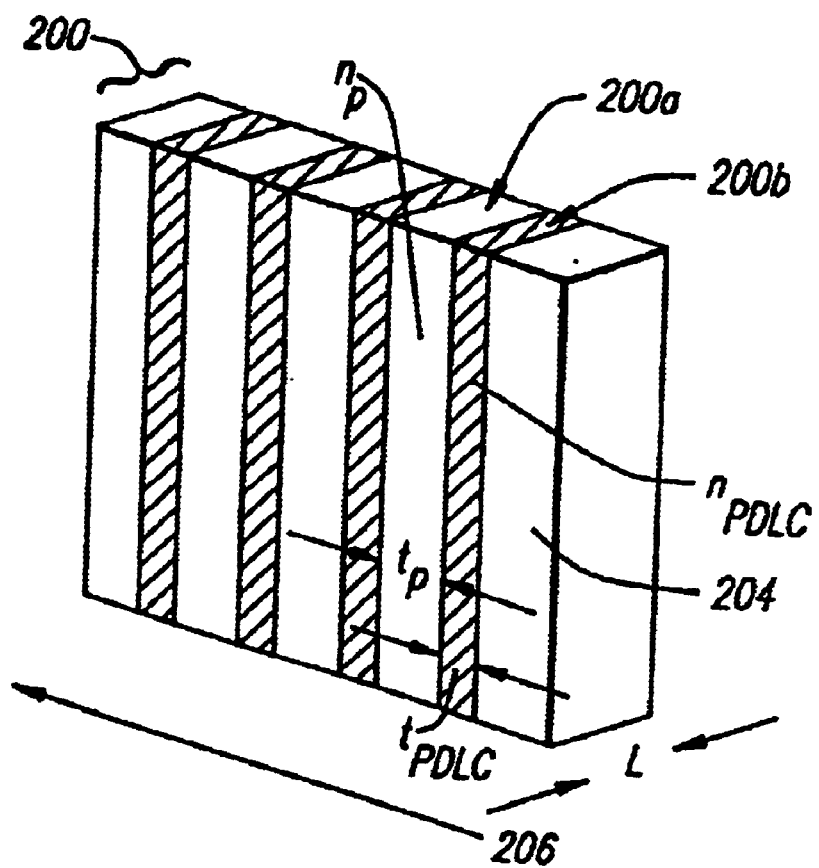
FIG. 13 is an elevational view of a subwavelength grating in accordance with the present invention having periodic planes of polymer channels and PDLC channels disposed perpendicular to the front surface of the grating.

In another embodiment of the present invention, PDLC materials can be made that exhibit a property known as form birefringence whereby polarized light that is transmitted through the grating will have its polarization modified. Such gratings are known as subwavelength gratings, and they behave like a negative uniaxial crystal, such as calcite, potassium dihydrogen phosphate, or lithium niobate, with an optic axis perpendicular to the PDLC planes. Referring now to FIG. 13, there is shown an elevational view of a transmission grating 200 in accordance with the present invention having periodic planes of polymer channels 200a and PDLC channels 200b disposed perpendicular to the front surface 204 of the grating 200. The optic axis 206 is disposed perpendicular to polymer planes 200a and the PDLC planes 200b. Each polymer plane 200a has a thickness $t_P$ and refractive index $n_P$ and each PDLC plane 200b has a thickness $t_{PDLC}$ and refractive index $n_{PDLC}$.

Where the combined thickness of the PDLC plane and the polymer plane is substantially less than an optical wavelength (i.e. $(t_{PDLC}+t_P)<<\lambda$), the grating will exhibit form birefringence. As discussed below, the magnitude of the shift in polarization is proportional to the length of the grating. Thus, by carefully selecting the length, L, of the subwavelength grating for a given wavelength of light, one can rotate the plane of polarization or create circularly polarized light. Conseqluently, such subwavelength gratings can be designed to act as a half-wave or quarter-wave plate, respectively. Thus, an advantage of this process is that the birefringence of the material may be controlled by simple design parameters and optimized to a particular wavelength, rather than relying on the given birefringence of any material at that wavelength.

To form a half wave plate, the retardance of the subwavelength grating must be equal to one-half of a wavelength, i.e. retardance $=\lambda/2$, and to form a quarter-wave plate, the retardance must be equal to one-quarter of a wavelength, i.e. retardance $=\lambda/4$. It is known that the retardance is related to, the net birefringence, $|\Delta n|$, which is the difference between the ordinary index of refraction, $n_o$, and the extraordinary index of refraction $n_e$, of the sub-wavelength grating by the following relation:

Retardance=$|\Delta n|L=|n_e-n_o|L$

Thus, for a half-wave plate, i.e. a retardance equal to one-half of a wavelength, thel length of the subwavelength grating should be selected so that:

$L=\lambda/(2|\Delta n|)$

Similarly, for a quarter-wave plate, i.e. a retardance equal to one-quarter of a wavelength, the length of the subwavelength grating should be selected so that:

$Li=\lambda/(4|\Delta n|)$

Figure 14A:
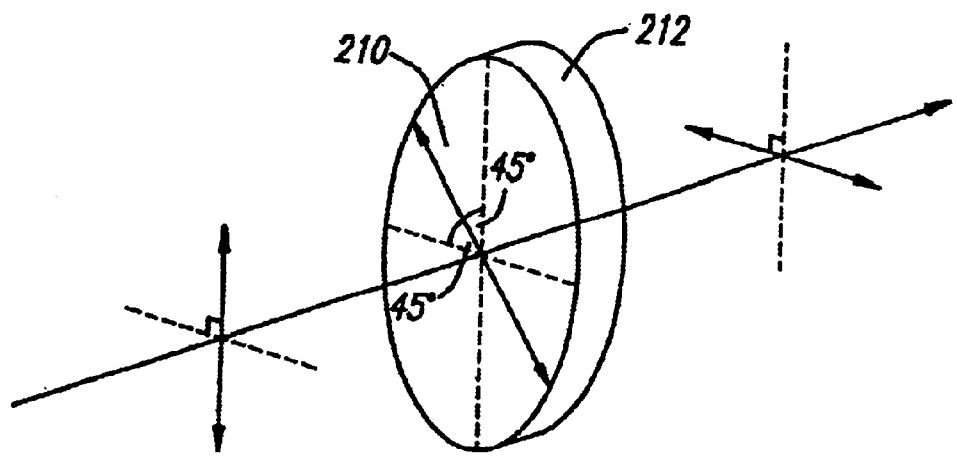
FIG. 14a is an elevational view of a switchable subwavelength grating in accordance with the present invention wherein the subwavelength grating functions as a half wave plate whereby the polarization of the incident radiation is rotated by 90°.
Figure 14B:
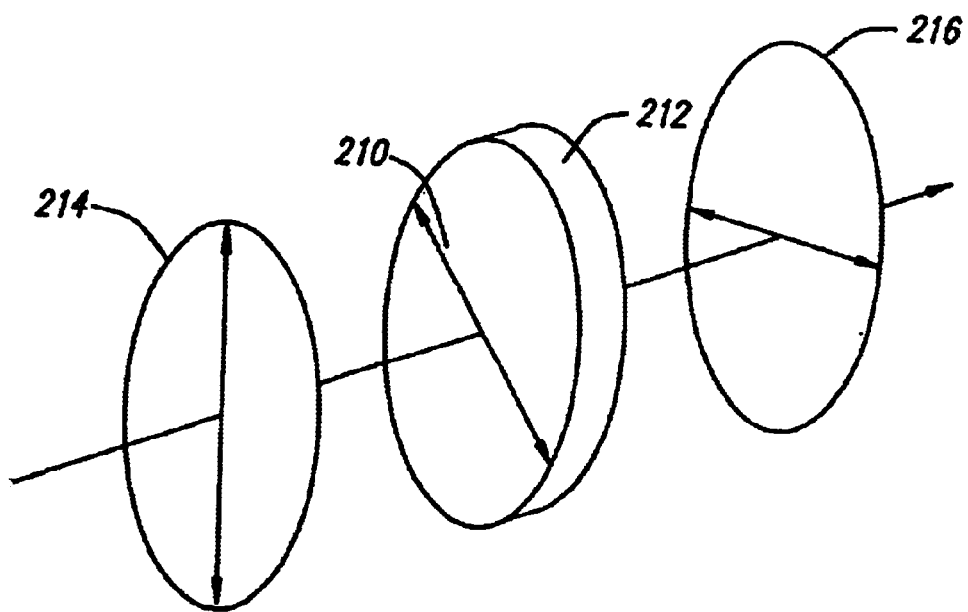
FIG. 14b is an elevational view of the switchable half wave plate shown in FIG. 14a disposed between crossed polarizers whereby the incident light is transmitted.

If, for example, the polarization of the incident light is at an angle of 45° with respect to the optic axis 210 of a half-wave plate 212, as shown in FIG. 14a, the plane polarization will be preserved, but the polarization of the wave exiting the plate will be shifted by 90°. Thus, referring now to FIGS. 14b and 14c, where the half-wave plate 212 is placed between cross polarizers 214 and 216, the incident light will be transmitted. If an appropriate switching voltage is applied, as shown in FIG. 14d, the polarization of the light is not rotated and the light will be blocked by the second polarizer.

For a quarter wave plate plane polarized light is converted to circularly polarized light. Thus, referring now to FIG. 15a, where quarter wave plate 217 is placed between a polarizing beam splitter 218 and a mirror 219, the reflected light will be reflected by the beam splitter 218. If an appropriate switching voltage is applied, as shown in FIG. 15b, the reflected light will pass through the beam splitter and be retroreflected on the incident beam.

Figure 16A:
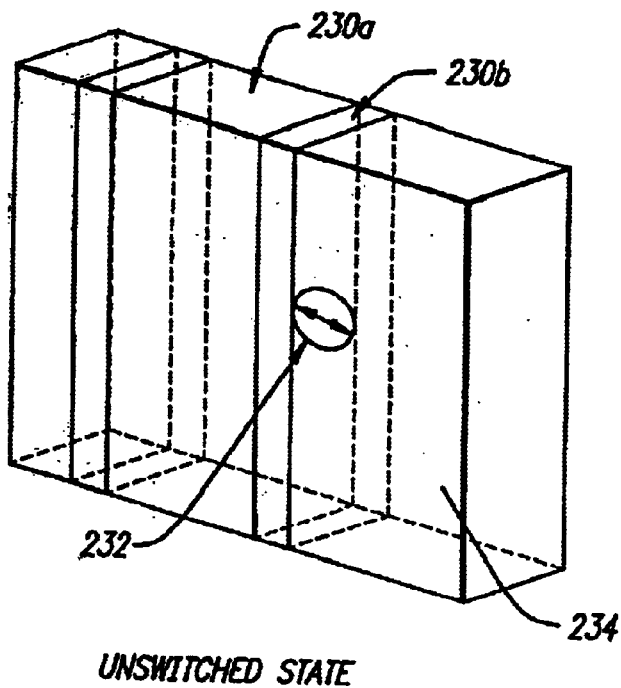
FIGS. 16a and 16b are elevational views of a subwavelength grating in accordance with the present invention having periodic planes of polymer channels and PDLC channels disposed perpendicular to the front face of the grating in the absence of an electric field (FIG. 16a) and with an electric field applied (FIG. 16b) wherein the liquid crystal utilized in formation of the grating has a positive dielectric anisotropy.
Figure 16B:
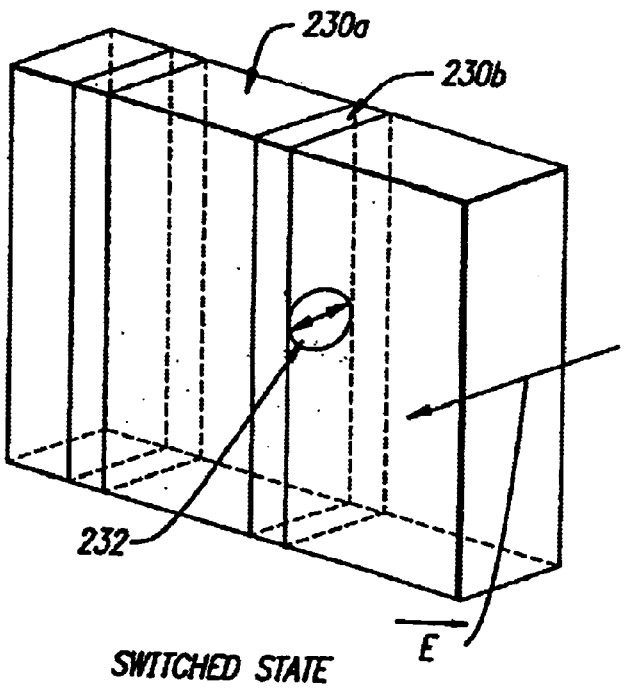

Referring now to FIG.16a, there is shown an elevational view of a subwavelength grating 230 recorded in accordance with the above-described methods and having periodic planes of polymer channels 230a and PDLC channels 230b disposed perpendicular to the front surface 234 of grating 230. As shown FIG. 16a, the symmetry axis 232 of the liquid crystal domains is disposed in a direction parallel to the front surface 234 of the grating and perpendicular to the periodic channels 230a and b of the grating 230. Thus, when an electric field E is applied across the grating, as shown in FIG. 15b, the symmetry axis 232 distorts and reorients in a direction along the field E, which is perpendicular to the front surface 234 of the rating and parallel to the periodic channels 230a and 230b of the grating 230. As a result, subwavelength grating 230 can be switched between a state where it changes the polarization of the incident radiation and a state in which it does not. Without wishing to be bound by any theory, it is currently believed that the direction of the liquid crystal domain symmetry 232 is due to a surface tension gradient which occurs as a result of the anisotropic diffusion of monomer and liquid crystal during recording of the grating, and that this gradient causes the liquid crystal domain symmetry to orient in a direction perpendicular to the periodic planes.

As discussed is Born and Wolf, Principles of Optics, 5th Ed., New York (1975) and incorporated herein by reference, the birefringence of a subwavelength grating is given by the following relation:

$$n_e^2 - n_o^2 = -\frac{[(f_{PDLC})(f_P)(n_{PDLC}^2 - n_P^2)]}{[f_{PDLC}n_{PDLC}^2 + f_P n_P^2]}$$

where $n_o$=the ordinary index of refraction of the subwavelength grating;

$n_e$=the extraordinary index of refraction;

$n_{PDLC}$=the refractive index of the PDLC plane;

$n_p$=the refractive index of the polymer plane;

$n_{LC}$=the effective refractive index of the liquid crystal seen by an incident optical wave;

$f_{PDLC}=t_{PDLC}/(t_{PDLC}+t_p)$ $f_p=t_p/(t_{PDLC}+t_p)$

Thus, the net birefringence of the subwavelength grating will be zero if $n_{PDLC}=n_p$.

It is known that the effective refractive index of the liquid crystal, $n_{LC}$, is a function of the applied electric field, having a maximum when the field is zero and a value equal to that of the polymer, $n_p$, at some value of the electric field, $E_{MAX}$. Thus, by application of an electric field, the refractive index of the liquid crystal, $n_{LC}$, and, hence, the refractive index of the PDLC plane can be altered. Using the relationship set forth above, the net birefringence of a subwavelength grating will be a minimum when $n_{PDLC}$ is equal to $n_p$, i.e. when $n_{LC}=n_p$. Therefore, if the refractive index of the PDLC plane can be matched to the refractive index of the polymer plane, i.e. $n_{PDLC}=n_p$ by the application of an electric field, the birefringence of the subwavelength grating can be switched off.

The following equation for net birefringence, i.e. $|\Delta n|=|n_e-n_o|$, follows from the equation given in Born and Wolf (reproduced above):

$$\Delta n = -\frac{[(f_{PDLC})(f_P)(n_{PDLC}^2 - n_P^2)]}{[2n_{AVG}(f_{PDLC}n_{PDLC}^2 + f_P n_P^2)]}$$

where $n_{AVG}=(n_e+n_o)/2$

Furthermore, it is known that the refractive index of the PDLC plane $n_{PDLC}$ is related to the effective refractive index of the liquid crystal seen by an incident optical wave, $n_{LC}$, and the refractive index of the surrounding polymer plane, $n_p$, by the following relation:

$n_{PDLC}=n_p+f_{LC}[n_{LC}-n_p]$ where $f_{LC}$ is the volume fraction of liquid crystal dispersed in the polymer within the PDLC plane, $f_{LC}=[V_{LC}/(V_{LC}+V_P)]$.

By way of example, a typical value for the effective refractive index for the liquid crystal in the absence of an electric field is $n_{LC}=1.7$, and for the polymer layer $n_p=1.5$. For a grating where the thickness of the PDLC planes and the polymer planes are equal (i.e. $t_{PDLC}=t_p$, $f_{PDLC}=0.5=f_p$) and $f_{LC}=0.35$, the net birefringence, $\Delta n$, of the subwavelength grating is approximately 0.008. Thus, where the incident light has a wavelength of 0.8 μm, the length of the subwavelength grating should be 50 μm for a half-wave plate and 25 μm for a quarter-wave plate. Furthermore, by application of an electric field of approximately 5 V/μm, the refractive index of the liquid crystal can be matched to the refractive index of the polymer and the birefringence of the subwavelength grating turned off. Thus, the switching voltage, $V_n$, for a half-wave plate is on the order of 250 volts, and for a quarter-wave plate approximately 125 volts.

By applying such voltages, the plates can be switched between the on and off (zero retardance) states on the order of microseconds. As a means of comparison, current Pockels cell technology can be switched in nanoseconds with voltages of approximately 1000–2000 volts, and bulk nematic liquid crystals can be switched on the order of milliseconds with voltages of approximately 5 volts.

Figure 17:
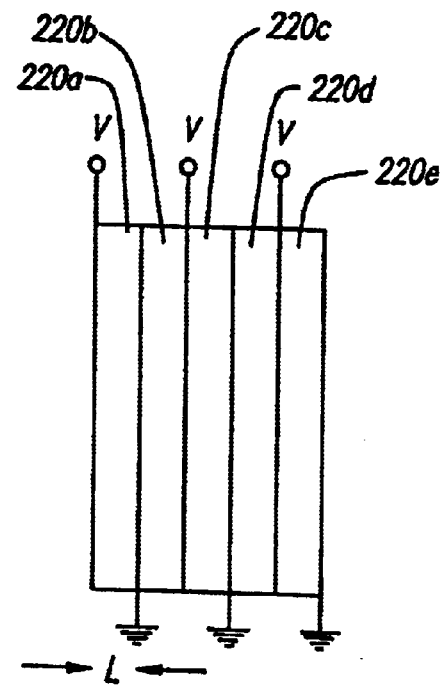
FIG. 17 is a side view of five subwavelength gratings wherein the gratings are stacked and connected electrically in parallel thereby reducing the switching voltage of the subwavelength grating.

In an alternative embodiment of the invention shown in FIG. 17, the switching voltage of the subwavelength grating can be reduced by stacking several subwavelength gratings 220a–e together, and connecting them electrically in parallel. By way of example, it has been found that a stack of five gratings each with a length of 10 μm yields the thickness required for a half-wave plate. it should be noted that the length of the sample is somewhat greater than 50 μm, because each grating includes an indium-tin-oxide coating which acts as a transparent electrode. The switching voltage for such a stack of plates, however, is only 50 volts.

Subwavelength gratings in accordance with the present invention are expected to find suitable application in the areas of polarization optics and optical switches for displays and laser optics, as well as tunable filters for telecommunications, colorimetry, spectroscopy, laser protection, and the like. Similarly, electrically switchable transmission gratings have many applications for which beams of light must be deflected or holographic images switched. Among these applications are: Fiber optic switches, reprogrammable NxN optical interconnects for optical computing, beam steering for laser surgery, beam steering for laser radar, holographic image storage and retrieval, digital zoom optics (switchable holographic lenses), graphic arts and entertainment, and the like.

A switchable hologram is one for which the diffraction efficiency of the hologram may be modulated by the application of an electric field, and can be switched from a fully on state (high diffraction efficiency) to a fully off state (low or zero diffraction efficiency). A static hologram is one whose properties remain fixed independent of an applied field. In accordance with the present invention, a high contrast static hologram can also be created. In this variation of the present invention, the holograms are recorded as described previously. The cured polymer film is then soaked in a suitable solvent at room temperature for a short duration and finally dried. For the liquid crystal E7, methanol has shown satisfactory application. Other potential solvents include alcohols such as ethanol, hydrocarbons such as hexane and heptane, and the like. When the material is dried, a high contrast static hologram with high diffraction efficiency results. The high diffraction efficiency is a consequence of the large index modulation in the film (Δn~0.5) because the second phase domains are replaced with empty (air) voids (n~1).

Similarly, in accordance with the present invention, a high birefringence static sub-wavelength wave-plate can also be formed. Due to the fact that the refractive index for air is significantly lower than for most liquid crystals, the corresponding thickness of the half-wave plate would be reduced accordingly. Synthesized wave-plates in accordance with the present invention can be used in many applications employing polarization optics, particularly where a uaterial of the appropriate birefringence at the appropriate wavelength is unavailable, too costly, or too bulky.

In the claims, the term polymer-dispersed liquid crystals and polymer-dispersed liquid crystal material includes, as may be appropriate, solutions in which none of the monomers have yet polymerized or cured, solutions in which some polymerization has occurred, and solutions which have undergone complete polymerization. Those of skill in the art in the field of the invention will clearly understand that the use herein of the standard term used in the art, polymer-dispersed liquid crystals (which grammatically refers to liquid crystals dispersed in a fully polymerized matrix) is meant to include all or part of a more grammatically correct prepolymer-dispersed liquid crystal material or a more grammatically correct starting material for a polymer-dispersed liquid crystal material.

It will be seen that modifications to the invention as described may be made, as might occur to one with skill in the field of the invention, within the intended scope of the claims. Therefore, all embodiments contemplated have not been shown in complete detail. Other embodiments may be developed without departing from the spirit of the invention or from the scope of the claims.

We Claim:

1. A switchable wavelength filter for laser protection made by exposing an interference pattern inside a polymer-dispersed liquid crystal material, the polymer-dispersed liquid crystal material comprising, before exposure,:
   (a) a polymerizable monomer;
   (b) a liquid crystal;
   (c) a cross-linking monomer;
   (d) a coinitiator; and
   (e) a photoinitiator dye;
   whereby the polymer-dispersed liquid crystal material is adapted to reflect radiation after exposure.

2. The switchable wavelength filter for laser protection according to claim 1, wherein the polymer-dispersed liquid crystal material further comprises, before exposure, a surfactant.

3. The switchable wavelength filter for laser protection of claim 1, wherein:
   (a) the liquid crystal comprises 10–40% by total weight of the polymer-dispersed liquid crystal material;
   (b) the cross-linking monomer comprises 5–15% by total weight of the polymer-dispersed liquid crystal material;
   (c) the amount of coinitiator is 10(−3) to 10(−4) gram moles; and
   (d) the amount of photoinitiator dye is 10(−5) to 10(−6) gram moles.

4. The switchable wavelength filter for laser protection of claim 1, wherein:
   (a) the liquid crystal comprises 10–40% by total weight of the polymer-dispersed liquid crystal material;
   (b) the cross-linking monomer comprises 10–18% by total weight of the polymer-dispersed liquid crystal material;
   (c) the coinitiator comprises 2–3% by total weight of the polymer-dispersed liquid crystal material; and
   (d) the photoinitiator dye comprises 0.2–0.4% by total weight of the polymer-dispersed liquid crystal material.

5. The switchable wavelength filter for laser protection according to claim 2, wherein the surfactant comprises about 6% by total weight of the polymer-dispersed liquid crystal material.

6. The switchable wavelength filter for laser protection according to claim 2, wherein the surfactant comprises about 5–10% by total weight of the polymer-dispersed liquid crystal material.

7. The switchable wavelength filter for laser protection according to claim 1, wherein the liquid crystal includes a mixture of cyano biphenyls.

8. The switchable wavelength filter for laser protection according to claim 1, wherein the cross linking monomer comprises N-vinylpyrrolidone.

9. The switchable wavelength filter for laser protection according to claim 1, wherein the coinitiator comprises N-phenylglycine.

10. The switchable wavelength filter for laser protection according to claim 1, wherein the photoinitiator dye comprises rose bengal ester.

11. The switchable wavelength filter for laser protection according to claim 2, wherein the surfactant comprises octanoic acid.

12. The switchable wavelength filter for laser protection of claim 1, wherein the polymerizable monomer comprises dipentarythritol hydroxypentaacrylate.

13. The switchable wavelength filter for laser protection according to claim 1, wherein the liquid crystal comprises 4'-n-pentyl-4-cyanobiphenyl.

14. The switchable wavelength filter for laser protection according to claim 1, wherein the polymer-dispersed liquid crystal material comprises 0.2% by weight to 0.4% by weight of a photoinitiator dye.

15. The switchable wavelength filter for laser protection according to claim 1, wherein the polymer-dispersed liquid crystal material comprises a photoinitiator dye comprising rose bengal sodium salt.

16. The switchable wavelength filter for laser protection according to claim 1, wherein the polymer-dispersed liquid crystal material comprises about 2% by weight to 3% by weight of a coinitiator.

17. The switchable wavelength filter for laser protection according to claim 1, wherein the polymer-dispersed liquid crystal material comprises a coinitiator comprising N-phenylglycine; and a photoinitiator dye comprising camphorquinone.

18. The switchable wavelength filter for laser protection according to claim 1, wherein the polymer-dispersed liquid crystal material comprises about 10% by weight to 18% by weight of a cross-linking monomer.

* * * * *